(12) United States Patent
Ravi et al.

(10) Patent No.: US 11,271,492 B2
(45) Date of Patent: Mar. 8, 2022

(54) MEDIUM VOLTAGE PLANAR DC BUS DISTRIBUTED CAPACITOR ARRAY

(71) Applicant: VIRGINIA TECH INTELLECTUAL PROPERTIES, INC., Blacksburg, VA (US)

(72) Inventors: Lakshmi Ravi, Blacksburg, VA (US); Joshua Stewart, Blacksburg, VA (US); Dong Dong, Blacksburg, VA (US); Rolando Burgos, Blacksburg, VA (US)

(73) Assignee: VIRGINA TECH INTELLECTUAL PROPERTIES, INC., Blacksburg, VA (US)

( * ) Notice: Subject to any disclaimer, the term of this patent is extended or adjusted under 35 U.S.C. 154(b) by 0 days.

(21) Appl. No.: 16/939,914

(22) Filed: Jul. 27, 2020

(65) Prior Publication Data
US 2022/0029549 A1  Jan. 27, 2022

(51) Int. Cl.
*H05K 1/02* (2006.01)
*H05K 1/11* (2006.01)
(Continued)

(52) U.S. Cl.
CPC .......... *H02M 7/003* (2013.01); *H05K 1/0219* (2013.01); *H05K 1/116* (2013.01)

(58) Field of Classification Search
CPC .. H05K 1/14; H05K 1/141; H05K 1/11–1/119
See application file for complete search history.

(56) References Cited

U.S. PATENT DOCUMENTS

| | | | | |
|---|---|---|---|---|
| 5,907,475 A | * | 5/1999 | Babinski | .................. H05K 1/14 361/719 |
| 6,373,220 B1 | * | 4/2002 | Wipperfurth | ......... H01M 50/20 320/107 |

(Continued)

OTHER PUBLICATIONS

S. Ji, Z. Zhang and F. Wang, "Overview of high voltage sic power semiconductor devices: development and application," in CES Transactions on Electrical Machines and Systems, vol. 1, No. 3, pp. 254-264, Sep. 2017.
(Continued)

*Primary Examiner* — Hoa C Nguyen
(74) *Attorney, Agent, or Firm* — Thomas | Horstemeyer, LLP.; Jason M. Perilla

(57) ABSTRACT

An inverter with a modular bus assembly is described. In various embodiments, the modular bus assembly includes a laminated motherboard and a plurality of capacitor daughtercards. The laminated motherboard can be configured to interface a plurality of phase-leg modules and a plurality of capacitor daughtercards through a plurality of terminals and connectors located on a bottom side or a top side of the laminated motherboard. The laminated motherboard includes a layer stack with a plurality of conductor layers. Each of the plurality of conductor layers is implemented with a net spacing from a neighboring plated through hole (PTH) based at least in part on differences in potential to be applied to each of the plurality of conductor layers as compared to a potential to be applied to the PTH. Embedded shield polygons can be implemented on the laminated motherboard to mitigate surface discharge at surface terminal (PTH/SMT) triple junctions.

20 Claims, 13 Drawing Sheets

(51) Int. Cl.
  H05K 1/14    (2006.01)
  H02M 7/00   (2006.01)

(56) References Cited

U.S. PATENT DOCUMENTS

| | | | | |
|---|---|---|---|---|
| 10,199,977 | B1* | 2/2019 | Mohammadpour | ... H05K 1/181 |
| 2009/0310280 | A1* | 12/2009 | Prymak | H01G 4/38 |
| | | | | 361/328 |
| 2011/0122669 | A1* | 5/2011 | Santos | H02M 7/003 |
| | | | | 363/141 |
| 2012/0139483 | A1* | 6/2012 | Cottet | H05K 1/0295 |
| | | | | 320/107 |
| 2013/0003299 | A1* | 1/2013 | Wissner | H02M 7/003 |
| | | | | 361/695 |
| 2016/0209901 | A1* | 7/2016 | Wilcox | H05K 7/1492 |
| 2016/0309622 | A1* | 10/2016 | Lei | H05K 7/20927 |
| 2017/0265337 | A1* | 9/2017 | Lei | H02M 7/003 |
| 2018/0367055 | A1* | 12/2018 | Kitamura | H01G 9/28 |
| 2019/0181770 | A1* | 6/2019 | Martin | H05K 1/0271 |

OTHER PUBLICATIONS

G. L. Skibinski, and D. M. Divan, "Design methodology and modeling of low inductance planar bus structures," 1993 Fifth European Conference on Power Electronics and Applications, Brighton, UK, 1993, pp. 98-105 vol 3.

M.C. Caponet, F. Profumo, R.W. De Doncker and A. Tenconi, "Low stray inductance bus bar design and construction for good EMC performance in power electronic circuits", IEEE Transactions on Power Electronics, vol. 17, No. 2, 2002, pp. 225231.

N. R. Mehrabadi, I. Cvetkovic, J. Wang, R. Burgos and D. Boroyevich, "Busbar design for SiC-based H-bridge PEBB using 1.7 kV, 400 a SiC MOSFET s operating at 100 kHz," 2016 IEEE Energy Conversion Congress and Exposition (ECCE), Milwaukee, WI, 2016, pp. 1-7.

J. M. Allocco, "Laminated bus bars for power system interconnects," IEE Colloquium on Passive Components for Power Electronic Systems, London, UK, 1998, pp. 5/1-5/7.

Y. Xu et al., "Medium Voltage SiC based Converter Laminated Bus Insulation Design and Assessment," in IEEE Journal of Emerging and Selected Topics in Power Electronics. vol. 7, No. 3; Sep. 2019.

D. Min et al., "Thickness-Dependent DC Electrical Breakdown of Polyimide Modulated by Charge Transport and Molecular Displacement," 2018 Polymers. 10. 1012. 10.3390/polym10091012.

Diaham, S.; Zelmat, S.; Locatelli, M.L.; Dinculescu, S.; Decup, M.; Lebey, T. "Dielectric Breakdown of Polyimide Films: Area, Thickness and Temperature Dependence". IEEE Trans. Dielectr. Electr. Insul. 2010, 17, 1827.

B. Aberg, R. S. K. Moorthy, L. Yang, W. Yu and I. Husain, "Estimation and minimization of power loop inductance in 135 kW SiC traction inverter," 2018 IEEE Applied Power Electronics Conference and Exposition (APEC), San Antonio, TX, 2018, pp. 1772-1777.

Cree, ""Design Considerations for Designing with Cree SiC Modules Part 2. Techniques for Minimizing Parasitic Inductance, App Note CPRWAN13, 2013.

J. Stewart, Y. Xu, R. Burgos and M. Ghassemi, "Design of a Multilayer PCB Bus for Medium Voltage DC Converters," 2019 IEEE Electric Ship Technologies Symposium (ESTS), Washington, DC, USA, 2019, pp. 329-336.

C. F. Bayer, E. Baer, U. Waitrich, D. Malipaard and A. Schletz, "Simulation of the electric field strength in the vicinity of metallization edges on dielectric substrates," in IEEE Transactions on Dielectrics and Electrical Insulation, vol. 22, No. 1, pp. 257-265, Feb. 2015.

M. Vujacic, M. Hammami, M. Srndovic and G. Grandi, "Analysis of dc-Link Voltage Switching Ripple in Three-Phase PWM Inverters", Energies 2018, 11, 471.

S. Tiwari, O. -. Midtgrd and T. M. Undeland, "Design of low inductive busbar for fast switching SiC modules verified by 3D FEM calculations and laboratory measurements," 2016 IEEE 17th Workshop on Control and Modeling for Power Electronics (COMPEL), Trondheim, 2016, pp. 1-8.

G. Mitic and G. Lefranc, "Localisation of electrical-insulation- and partial-discharge failures of IGBT modules," Conference Record of the 1999 IEEE Industry Applications Conference. Thirty-Fourth IAS Annual Meeting (Cat. No. 99CH36370), Phoenix, AA, USA, 1999, pp. 1453-1458 vol. 2.

N. Wang, I. Cotton, J. Robertson, S. Follmann, K. Evans and D. Newcombe, "Partial discharge control in a power electronic module using high permittivity non-linear dielectrics," in IEEE Transactions on Dielectrics and Electrical Insulation, vol. 17, No. 4, pp. 1319-1326, Aug. 2010.

Isola Group, Laminate & Prepreg Manufacturing, 2016. [Online]. Available https://www.isola-group.com/wp-content/uploads/Understanding-Laminate-Prepreg-Manufacturing.pdf.

R. Tarzwell and K. Bahl, "High voltage printed circuit design and manufacturing notebook", Sierra Proto Express, 2004.

Isola Group, Isola 370HR Datasheet, 2016. [Online]. Available https://www.isola-group.com/wp-content/uploads/data-sheets/370hr.pdf.

S. Mukherjee et al., "Toward Partial Discharge Reduction by Corner Correction in Power Module Layouts," 2018 IEEE 19th Workshop on Control and Modeling for Power Electronics (COMPEL), Padua, 2018, pp. 1-8.

IEC 60270:2000: High-voltage test techniques—Partial discharge measurements. Dec. 21, 2000.

SBE Inc., "Power Ring Film CapacitorTM." Accessed on: Feb. 21, 2020. [Online]. Available: https://www.sbelectronics.com/products/dc-link-capacitors-for-conversion-and-inverters/.

D. Zhang, J. He and D. Pan, "A Megawatt-Scale Medium-Voltage High Efficiency High Power Density "SiC+Si" Hybrid Three-Level ANPC Inverter for Aircraft Hybrid-Electric Propulsion Systems," 2018 IEEE Energy Conversion Congress and Exposition (ECCE), Portland, OR, 2018, pp. 806-813.

J. Wang et al., "Design and Testing of 6 kV H-bridge Power Electronics Building Block Based on 10 kV SiC MOSFET Module," 2018 International Power Electronics Conference (IPEC-Niigata 2018—ECCE Asia), Niigata, 2018, pp. 3985-3992.

J. Stewart, J. Neely, J. Delhotal and J. Flicker, "DC link bus design for high frequency, high temperature converters," 2017 IEEE Applied Power Electronics Conference and Exposition (APEC), Tampa, FL, 2017, pp. 809-815.

* cited by examiner

MEDIUM VOLTAGE PLANAR DC BUS DISTRIBUTED CAPACITOR ARRAY

STATEMENT REGARDING FEDERALLY SPONSORED RESEARCH OR DEVELOPMENT

This invention was made with government support under grant number DE-EE0006521, awarded by the office of Energy Efficiency and Renewable Energy (EERE) and the U.S. Department of Energy. The government has certain rights in the invention.

BACKGROUND

Medium voltage (MV) power converters are widely used in MV motor drive applications and in grid connected power electronics systems for integration of renewable energy sources into the power grid. Recent developments in medium voltage wide-bandgap (WBG) semiconductor technology, such as new 10 kV Silicon Carbide (SiC) devices, have enabled simpler topologies for MV converters, making compact and high power density designs achievable. In addition, laminated bus structures with reliable insulation design are crucial for safe operation of MV SiC based power converters.

BRIEF DESCRIPTION OF THE DRAWINGS

Many aspects of the present disclosure can be better understood with reference to the following drawings. The components in the drawings are not necessarily to scale, with emphasis instead being placed upon clearly illustrating the principles of the disclosure. Moreover, in the drawings, like reference numerals designate corresponding parts throughout the several views.

DETAILED DESCRIPTION

To mitigate the effects of fast switching currents, which can be particularly important in Silicon Carbide (SiC) based power converters, laminated direct current (DC) bus structures are preferred for power delivery, as they provide lower interconnection impedance while improving overall system integration and mechanical stability. For medium voltage (MV) power converters, it is also important that the DC bus has a reliable insulation design at the desired MV DC operating voltage.

Conventional laminated bus structures are made of vertically stacked copper plates and insulator layers laminated together into a single unified assembly. These structures are prone to internal air voids, leading to partial discharges (PD) and consequently a lower product lifetime. For example, a conventional laminated bus with a total thickness of 17 mm, designed for a PD free operation up to 8 kV, may have a lower partial discharge inception voltage (PDIV)—5.23 kV alternating current (AC) peak voltage in this case—falling short of the target due to defects in the finished assembly. One possible method to increase the PDIV is to increase the insulation thickness (e.g., conductor separation) to reduce the background electric field (E-field) strength. However, the dielectric strength of solid insulators drop with increasing thickness by an inverse power law depending on the material. In the previous example, a successful design that can achieve the 8 kV PDIV target can be close to twice the original designed thickness. It should be noted that increased conductor separation also increases the parasitic inductance of the parallel plate structure for a fixed plate width along with its total weight.

Another option to increase PDIV is to opt for a printed circuit board (PCB) based lamination, which offers an automated fabrication process where the lamination is carried out in a vacuum resulting in a virtually defect-free final product. PCB laminated bus structures have been reported for low voltage applications, but research for medium to high voltage applications is still ongoing. In the present disclosure, a laminated bus assembly comprising a multilayer PCB stack is described. In one example, for a 16 kV rated three phase inverter, the assembly can integrate a number of power modules, a medium voltage (MV) capacitor bank, series-device static balancing resistors, and inverter AC output terminals.

Throughout this disclosure, the term "conductor" generally refers to a conductive metal such as copper. However, other suitable conductive metals such as aluminum or copper alloys may be used. The term "dielectric" or "insulator" may refer to, as non-limiting examples, flame resistant substrates such as FR-2 and FR-4, polyimides, and flexible substrates such as Kapton®, Upilex®, and Pyralux®. Additional non-limiting examples may include insulating materials such as Nomex®, Tedlar®, Mylar®, Ultem®, Mylar®/Tedlar®, Tedlar®/Mylar®/Tedlar®, Valox®, and epoxy-glass.

Figure 1:
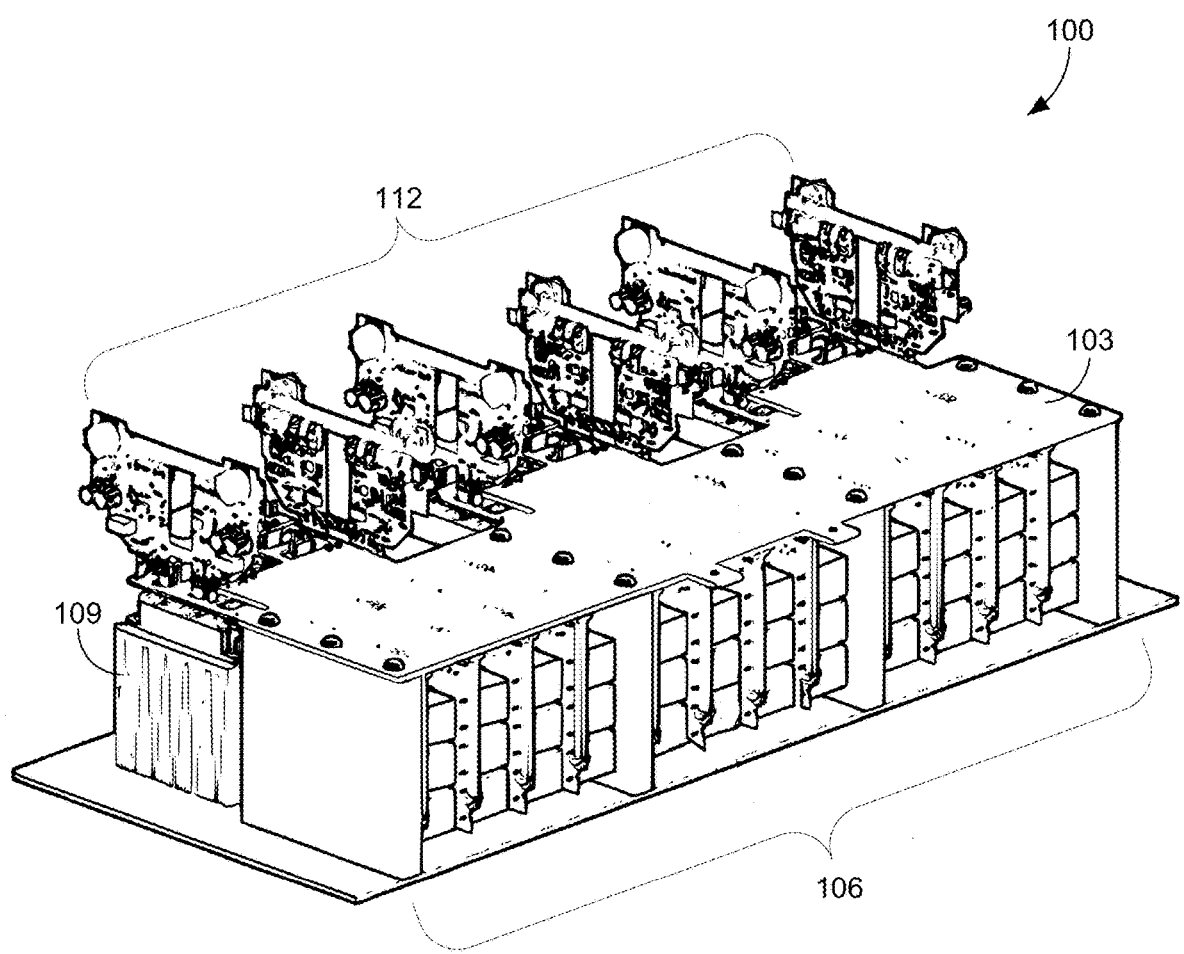
FIG. 1 illustrates an inverter bus assembly with a modular direct current (DC) bus.

Turning now to the drawings, FIG. 1 illustrates an inverter 100 with a modular DC bus assembly. Among other components (including some components not illustrated), the inverter 100 includes a laminated motherboard 103 that may be constructed as a printed circuit board (PCB) or as a conventional laminated bus structure. The laminated motherboard 103 can be formed as vertically stacked copper plates and insulator layers laminated together into a single unified assembly. The inverter 100 includes twelve capacitor daughtercards 106 that form a MV capacitor bank. The capacitor daughtercards 106 are electrically connected through the laminated motherboard 103. Each of the capacitor daughtercards 106, as shown in FIG. 1, is electrically connected directly to the laminated motherboard 103 through connectors or terminals located on a bottom side of the laminated motherboard 103.

The capacitor daughtercards 106, along with the laminated motherboard 103, may have a modular implementation, where the capacitor daughtercards 106 are able to be taken out of the inverter 100 as a result of plug-in/plug-out connections to the laminated motherboard 103. The capacitor daughtercards 106 and the laminated motherboard 103 form a motherboard-daughtercard configuration that allows some freedom in the design to optimize the dimensions of the inverter 100 to suit a particular application and/or form factor. Although twelve (12) capacitor daughtercards are depicted in FIG. 1, the inverter 100 may include greater or fewer than 12 capacitor daughtercards depending on the system voltage/power rating. The capacitor daughtercards 106 and the laminated motherboard 103 form a modular DC bus assembly for the inverter 100.

The inverter 100 also includes a number of power modules and a heat sink 109. In one example, the power modules and heat sink 109 may include six XHV-9 10 kV, 16A SiC MOSFET half-bridge power modules, where two devices in each XHV-9 module are operated synchronously to form a single 20 kV switch. The nominal output power of the inverter 100 may measure 200 kW for a rated current of 10.5 Arms. The inverter 100 also includes a number of gate drivers 112, where each gate driver 112 connects to a separate power module and a heat sink 109. In other examples, the inverter 100 may include fewer or greater gate drivers 112 than depicted in FIG. 1. The inverter 100 may also be a three phase inverter and be rated to operate at 16 kV. The minimum required capacitance for a rated power $P_{rat}$ of 200 kW with a 1 ms hold-up time $T_h$ and 10% maximum deviation in bus voltage $V_{dc}$ (1600 V) is calculated to be 7.6 µF. Based on this calculation, the design target for the modular DC bus assembly was chosen as 18 kV, 9 µF in one embodiment.

$$C_{dc,min} \geq \frac{P_{rat}T_h}{V_{dc}\Delta V_{dc} + \left(\frac{1}{2}\Delta V_{dc}^2\right)} \quad (1)$$

Figure 2:
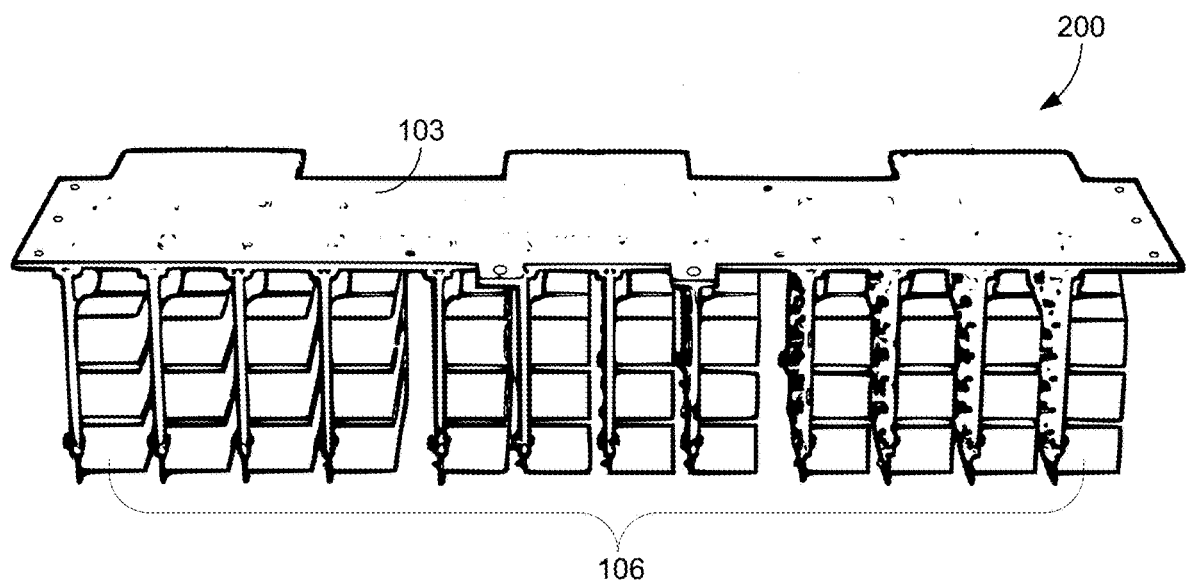
FIG. 2 illustrates the modular DC bus shown in FIG. 1, which includes a laminated motherboard and twelve capacitor daughtercards.

FIG. 2 illustrates a modular DC bus assembly 200 configured for use in the inverter 100 shown in FIG. 1. The modular DC bus assembly 200 can be formed from the laminated motherboard 103 and the twelve capacitor daughtercards 106. Each of the capacitor daughtercards 106 includes an array of capacitors connected in a parallel configuration. For example, each of the capacitor daughtercards 106 may have a 3×3 array of nine capacitors connected in a parallel configuration. In one example, the laminated motherboard 103 is configured to connect and interface the capacitor daughtercards 106 in a series configuration. The modular DC bus assembly 200 may be configured to accommodate a PD free operation up to 18 kV DC voltage for the inverter 100. The laminated motherboard 103 also includes plated through holes (PTH) and non-plated through holes (NPTH) and surface mount (SMT) pads to lower insulation stress. In various embodiments, the laminated motherboard 103 can represent a PCB laminated bus.

Figure 3:
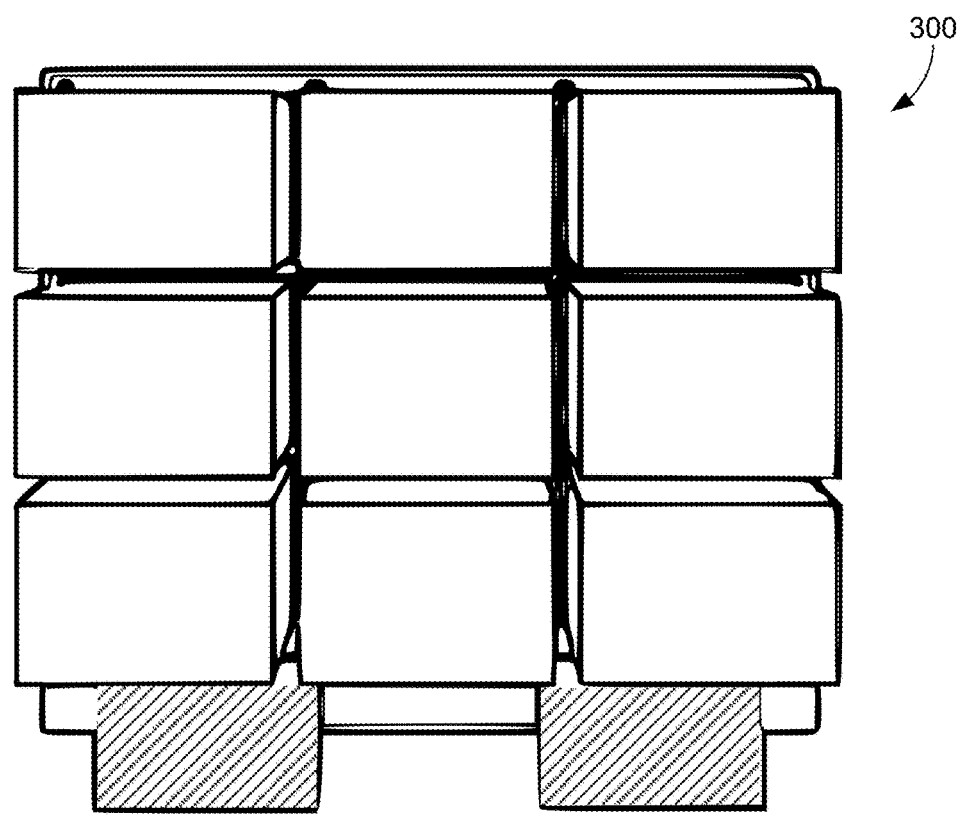
FIG. 3 illustrates an individual capacitor daughtercard of the twelve capacitor daughtercards shown in FIG. 2.

FIG. 3 illustrates an individual capacitor daughtercard 300 among the capacitor daughtercards 106. A market survey was performed to select a base capacitor unit for the individual capacitor daughtercard 300. Table I below shows a comparison of selected capacitor candidates.

TABLE I

| Capacitor Bank | Capacitor Candidates | | | |
|---|---|---|---|---|
| Parameters | A | B | C | D |
| Total Voltage (V) | 18,000 | 18,000 | 19,000 | 20,000 |
| Total Capacitance (µF) | 9 | 10.8 | 10.6 | 12.5 |
| Total ESL (nH) | 44 | 240 | 72 | 150 |
| Total Volume (cm$^3$) | 6,123 | 8,560 | 12,829 | 15,956 |
| Total Mass (kg) | 8.6 | 10.2 | 15.2 | 80 |

Commercial capacitors with a voltage rating greater than 2 kV are bulky and heavy, leading to poor power density designs. Capacitor A, a 1500 V, 12 µF Metallized Polypropylene film capacitor, was selected for the individual capacitor daughtercard 300, providing a 40% lower total volume and ESL and 20% lower total mass compared to the next best candidate.

Although capacitor A was selected for this design, any suitable capacitor may be selected for the individual capacitor daughtercard 300. To simplify the design and to keep the individual capacitor daughtercard 300 compact, the individual capacitor daughtercard 300 can be configured to be rated at 1500 V with a parallel configuration of a number of capacitors similar to the capacitor A according to various embodiments. For example, the capacitor individual daughtercard 300 can include a 3×3 array of capacitor A connected in parallel, for a total of nine capacitors. Dimensions of the individual capacitor daughtercard 300 may be selected to match the height of the power modules and a heat sink 109, thereby minimizing free space in the cabinet. The laminated motherboard 103 can be configured to connect twelve (12) of the individual capacitor daughtercards 300 in series to achieve the intended 18 kV design target according to one embodiment.

An important characteristic to note with the XHV-9, 16 A power modules utilized in the inverter 100 is that the worst case di/dt of each power module as measured from switching experiments was <0.5 A/ns—a relatively low value as the rated current is only 10.5 Arms. For this reason, the inverter 100 is not very sensitive to parasitic inductance in the switching power loop and the corresponding voltage overshoot $$\left(V_{os} = L_{loop}\frac{di}{dt}\right)$$

is not a big concern. However, as part of the modular design of the modular DC bus assembly 200, the laminated motherboard 103 layout is optimized for the lowest achievable loop inductance without compromising insulation design. Contributing to achieving a lower achievable loop inductance is the arrangement of phase-leg modules for the laminated motherboard 103. A side by side module arrangement is chosen for each phase-leg module of the laminated motherboard 103, to bring a DC+ and a DC− terminal for each phase-leg module closer together to achieve the shortest effective loop area compared to other possible arrangements (e.g., a vertical module stack). The side by side module arrangement can reduce the total inductance by at least 53% compared to a vertical module stack.

Figure 4:
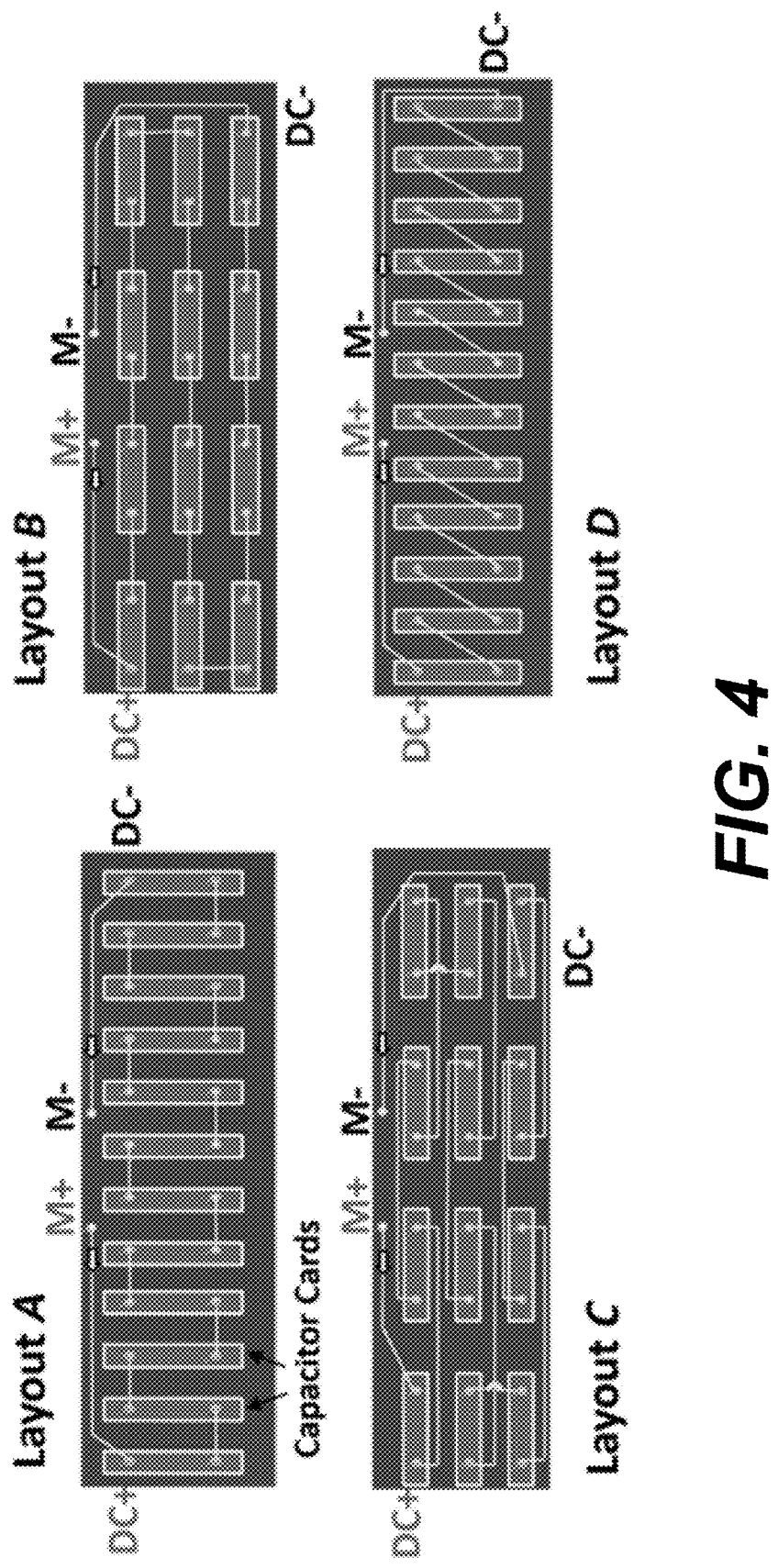
FIG. 4 illustrates four representative capacitor daughtercard layout options and current paths for each layout option according to aspects of the embodiments described herein.

FIG. 4 illustrates four representative capacitor daughter-card interconnection layout options (A-D), applicable to the 12 capacitor daughtercards 106, and current paths for each layout option. Each of the four layout options (A-D) is able to be interfaced by the laminated motherboard 103. Layout options B and C illustrate horizontal implementations of the interconnection of the 12 capacitor daughtercards 106, while layout options A and D illustrate vertical implementations. Four representative multilayer PCB coupons with the layout options (A-D) were simulated in ANSYS® Q3D® to determine the best interconnection implementation of the 12 capacitor daughtercards 106 that would provide the lowest loop inductance of the four layout options. The lines on each layout indicate the current path from DC+ to DC−. Each coupon includes a dedicated conductor layer for each electrical net. From the relative parasitic inductance comparison shown in Table II below, layout A was chosen for the interconnection implementation of the capacitor daughtercards 106 in one case, as layout A had the lowest relative parasitic inductance of switching loop of the four layout options.

TABLE II

| Interconnection Layouts | Relative Parasitic Inductance of Switching Loop in p.u.* |
|---|---|
| Layout A | 1 p.u. |
| Layout B | 1.5 p.u. |
| Layout C | 1.54 p.u. |
| Layout D | 2.2 p.u. |

*Layout A is taken as baseline (e.g.., 1 p.u.).

Insulation Design of a Multilayer PCB for PD-Free Operation Up to 18 kV

The laminated motherboard 103, which includes a PCB stack, can be a parallel plate structure where the average E-field in each insulation layer ($E_{layer}$) between successive plates can be calculated as per equation (2) below, where $V_{layer}$ is the voltage applied across two plates and $N_{layer}$ represents thickness of an insulation layer between the two plates.

$$E_{layer} = \frac{V_{layer}}{t_{layer}} \quad (2)$$

However, the E-field at the edge of the successive plates can be multiple times the average value calculated due to the edge effect. Another concern is surface discharge on an external insulator and at triple junction points (e.g., at the interface between a conductor and two dielectrics) along exposed metal surfaces of the PCB (e.g., the component terminals).

Figure 5:
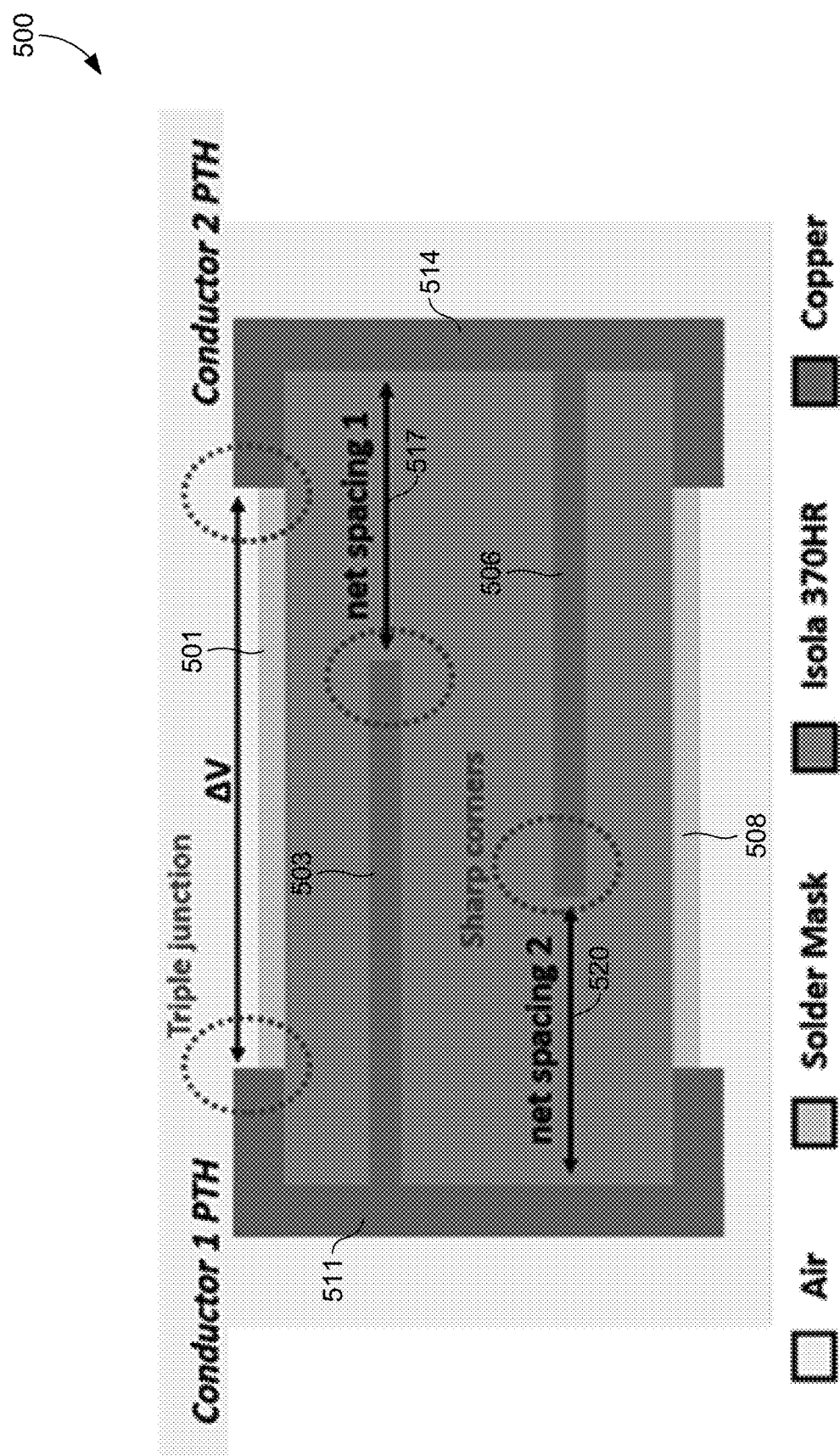
FIG. 5 illustrates a cross section of an example four layer printed circuit board (PCB) stack, highlighting areas that are prone to peak E-field crowding according to aspects of the embodiments described herein.

FIG. 5 illustrates a cross section of a four layer PCB stack 500 highlighting areas that are prone to peak E-field crowding. The four layer PCB stack 500 includes two conductor layers 503 and 506 that belong to different electrical nets with a certain differential voltage ΔV between them. A top layer 501 and a bottom layer 508 include solder mask but do not include any conductor layer having a dedicated electrical net. The conductor layers 503 and 506, and the top layer 501 and the bottom layer 508, form the four layer PCB stack 500 with dielectric material separating each layer. In contrast, many conventional PCB stacks incorporate conductor layers in top and bottom layers with a solder mask coating, which can lead to unwanted results such as: (i) the surface of the solder mask coating can have bubbles and other contamination leading to surface tracking between the outer conductor layer and an exposed pad of a different electrical net; (ii) the solder mask coating can scratch away easily exposing the coated conductor; (iii) the solder mask coating is a thin coating layer and does not contribute to a great reduction in the E-field at the PCB-air interface, which is critical.

Furthermore, the PCB stack 500 includes plated through holes (PTHs) 511 and 514 that function as vias. The PTH 511 is electrically connected to the conductor layer 503, and the two share a common potential during operation. The PTH 514 is electrically connected to the conductor layer 506, and the two also share a common potential during operation. The PTHs 511 and 514 each have exposed conductors, also known as annular rings, which extend out at ends of each hole of the PTHs 511 and 514, and onto top and bottom surfaces of the PCB stack 500. Annular rings aid in establishing a solid connection between a via and the copper traces around the via and also aid with the connection of external components. The conductor layers 503 and 506 are embedded between dielectric, such as Isola® 370HR. The circled areas indicate areas prone to peak E-field crowding, also known as triple junction points. The circled areas are also representative of areas prone to peak E-field crowding in other PCB stacks according to various embodiments of the present disclosure.

Spacing distance from one edge of a conductor layer to one edge of a PTH of a PCB stack of the laminated motherboard 103 is termed a "net spacing," as a conductor layer and a PTH may have different electrical nets. For example, the distance from one edge of the conductor layer 503 to one edge of the PTH 514 is net spacing 517. The distance from one edge of the conductor layer 506 to one edge of the PTH 511 is net spacing 520. The term "net spacing" will be described in further detail in later examples of the present disclosure.

It is known that sharp corners in conductor geometry can have high E-field concentrations. Therefore, copper features in PCB stacks of the various embodiments disclosed herein may be designed to have rounded corners with a maximum achievable fillet radius to lower E-field strength over a specific area. Such maximum achievable fillet radius may be applied to pad, plane, and trace corner radii. Sharp corners in conductor geometry may also be caused by breaks in the copper planes for PTH and non-plated through hole (NPTH) clearances that cannot be avoided. As the thicknesses of conductor layers in PCB stacks of the various embodiments disclosed herein may be in the several mils range, the conductor layers can exhibit enhanced E-field magnitudes as well. It is important to note that FIG. 5 represents merely one example of a PCB stack, and other PCB stacks with more or less layers than the four layer PCB stack 500 are within the various embodiments of the present disclosure.

Figure 6:
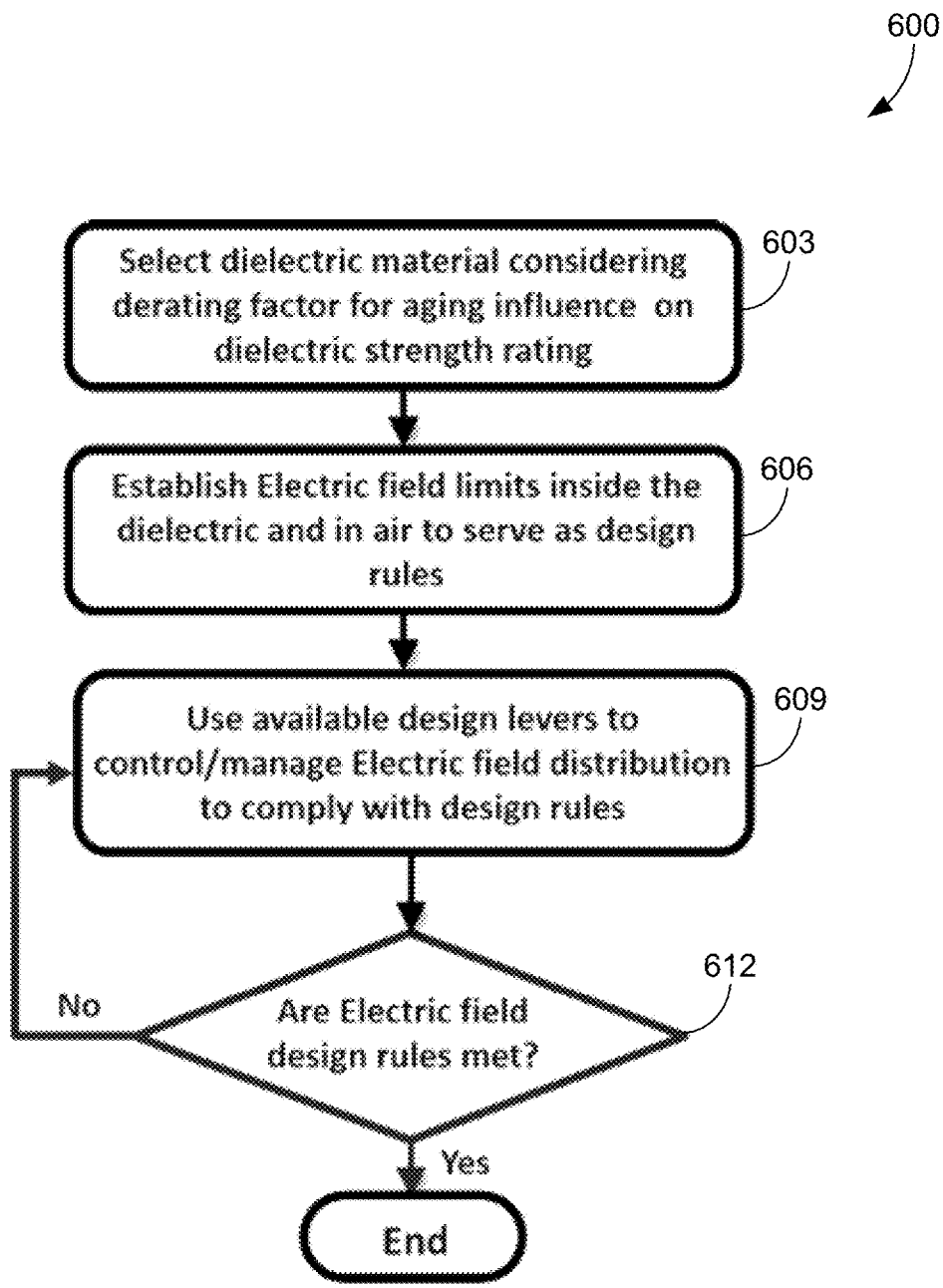
FIG. 6 illustrates a high-level design flowchart outlining the steps for the design of a medium voltage (MV) PCB laminated motherboard shown in FIG. 2 according to aspects of the embodiments described herein.

FIG. 6 illustrates a high-level design flowchart 600 outlining steps of the insulation design process for the laminated motherboard 103. Beginning with box 603, a PCB stack of the laminated motherboard 103 can be fabricated using premade dielectric cores laminated together with layers of pre-preg. It can be important to select and specify the material of the core and the pre-preg for medium to high voltage PCB designs. Materials with high dielectric strength (kV/mm) are preferred to reduce total insulation thickness and for operation margin. It can also be important to closely match the dielectric constant of all cores and pre-pregs in the PCB stack of the laminated motherboard 103. Pre-pregs with high resin content (e.g., 1080, 2113, 2116) and smaller glass weaves allow better penetration of resin during the curing process preventing micro bubble formation. Polyimides have a higher dielectric strength compared to FR4 material but require more complex processing. Table III below shows the materials considered for the dielectric material of the PCB stack.

TABLE III

| Dielectric Material | Published Dielectric Strength (kV/mm) | Derated Dielectric Strength (kV/mm) |
|---|---|---|
| HVPF (Polyimide) | 118 | 59 |
| Arlon ® 85HP (Polyimide) | 59 | 29.5 |
| Isola ® 370HR (FR4) | 53.15 | 26.5 |

Based on ease of processing and availability, Isola® 370 HR was chosen as the dielectric material for the PCB stack of the laminated motherboard 103 according to one embodiment. However, other suitable dielectric materials may be utilized. A derating factor of 0.5 was applied to the published dielectric strength rating to allow for degradation due to material aging based on the values provided in "*High voltage printed circuit design & manufacturing notebook*," by R. Tarzwell and K. Bahl, (Sierra Proto Express, design guide, Nov. 4, 2004), which is hereby incorporated by reference in its entirety.

Next, in box 606, design rules are set to prevent PDs and surface discharge. The following two limits are considered to serve as design rules for the PCB stack of the laminated motherboard 103: a) E-field at a PCB-air interface should be less than 2 kV/mm (e.g., $E_{air\text{-}limit}$=2 kV/mm); and b) E-field inside the PCB stack should be less than 20 kV/mm (e.g., $E_{PCB\text{-}limit}$=20 kV/mm).

Next, in box 609, available design levers are utilized to control and manage E-field distributions to comply with the design rules outlined in box 606. The available design levers can include the following: conductor geometry, conductor clearance for external layers, layer stack-up, net spacings for internal layers, and embedded shielding to reduce peak E-field crowding at exposed PCB surface pads. The following paragraphs will discuss these available design levers and the applicability to the design of the laminated motherboard 103.

In box 612, the laminated motherboard 103 can be tested to see if the E-field limits (e.g., $E_{air\text{-}limit}$=2 kV/mm, $E_{PCB\text{-}limit}$=20 kV/mm) established in box 606 are met. The capacitor daughtercards 106 can be tested in an ac PD test with a 60 Hz sine wave excitation as per IEC 60270 standard to ensure that the capacitor daughtercards 106 can withstand a target voltage of 1500 V without any PD. In addition, inverter phase-leg switching performance of phase-leg modules of the inverter 100 can be tested using a standard clamped inductive load test.

E-field distribution on surfaces of the laminated motherboard 103 can be influenced by external connections to the modular DC bus assembly 200 and corresponding surface terminal clearances. For this reason, it is important to determine phase-leg module spacings for the modular DC bus assembly 200, as the phase-leg module spacings serve as crucial connection points with a full bus voltage running across termination points.

Figure 7:
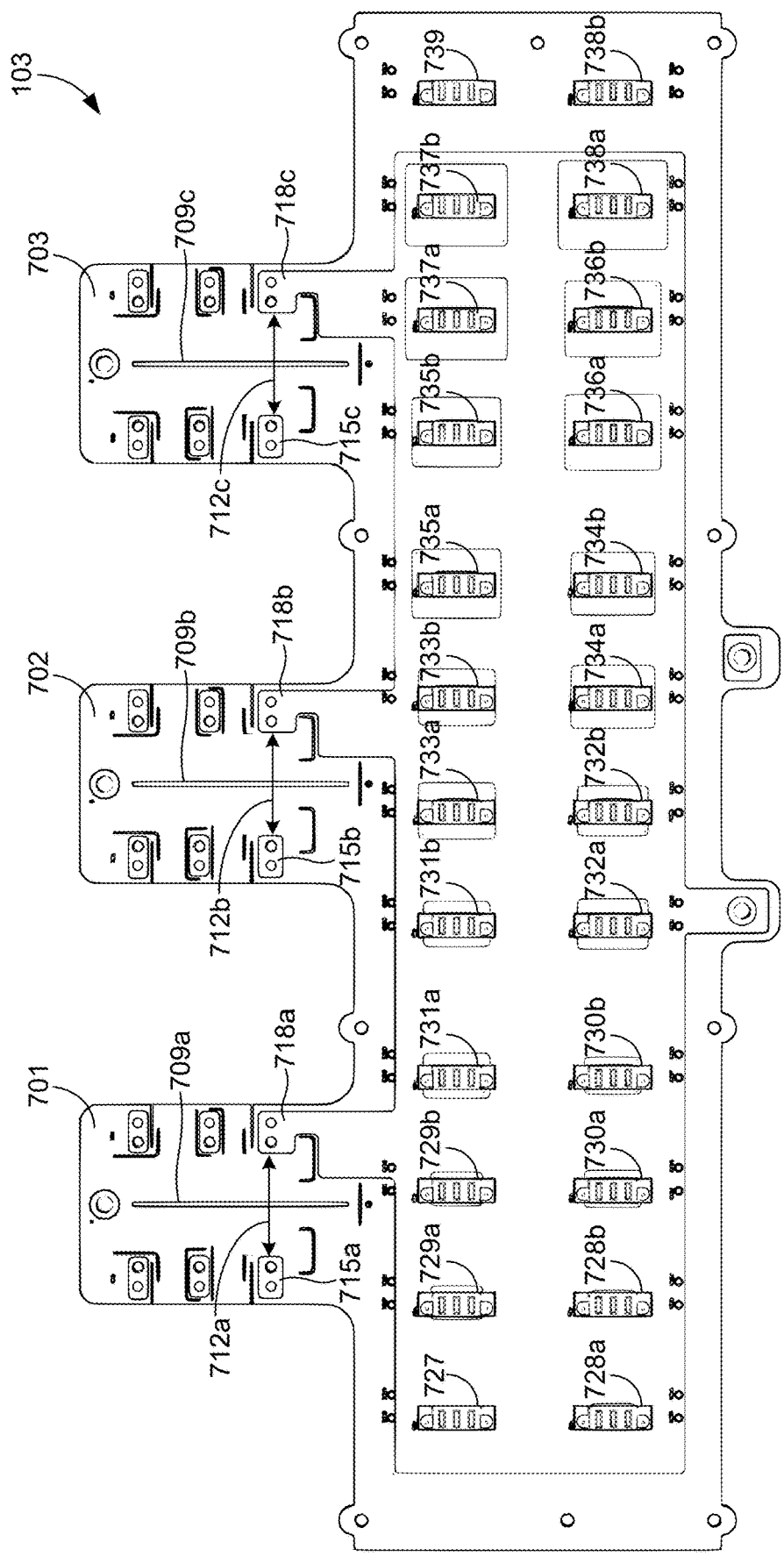
FIG. 7 illustrates a bottom side of the laminated motherboard shown in FIG. 2, which includes connections for phase-leg modules and the twelve capacitor daughtercards according to aspects of the embodiments described herein.

FIG. 7 illustrates a bottom side of the laminated motherboard 103 shown in FIG. 2 according to aspects of the embodiments described herein. The laminated motherboard 103 includes three phase-leg modules 701, 702, and 703. Each of the phase-leg modules 701, 702, and 703 includes at least a pair of DC− terminals and DC+ terminals. For example, the phase-leg module 701 includes DC− terminal 715a and DC+ terminal 718a; the phase-leg module 702 includes DC− terminal 715b and DC+ terminal 718b; and the phase-leg module 703 includes DC− terminal 715c and DC+ terminal 718c. The three phase-leg modules 701, 702, and 703 include air gapped slots 709a, 709b, and 709c, respectively, between the respective DC− terminals 715 and the respective DC+ terminals 718 of each phase-leg module. In various embodiments, the inverter 100 can be configured so that the full bus voltage, such as 16 kV, can run across the DC− terminals 715 and the DC+ terminals 718.

The air gapped slots 709a, 709b, and 709c are positioned between the respective DC− terminals 715 and the DC+ terminals 718 of each phase-leg module to increase creepage distances to account for contamination on the surfaces of the laminated motherboard 103. With the presence of the air gapped slots 709a, 709b, and 709c, the electric fields in the air gapped slots 709a, 709b, and 709c $E_{slots}$ become critical. A parametric sweep was conducted using COMSOL® electrostatic solver to determine minimum distances 712a, 712b, and 712c needed between the DC− terminal 715a and the DC+ terminal 718a, the DC− terminal 715b and the DC+ terminal 718b, and the DC− terminal 715c and the DC+ terminal 718c, respectively. In one case, it was found that the minimum distances 712 needed were at least 1 centimeter (cm), such that the peak E-field at triple junction points of PTH pads of the DC− terminals 715 and the DC+ terminals 718 conform to the design rules indicated in box 606 of FIG. 6.

Figure 8:
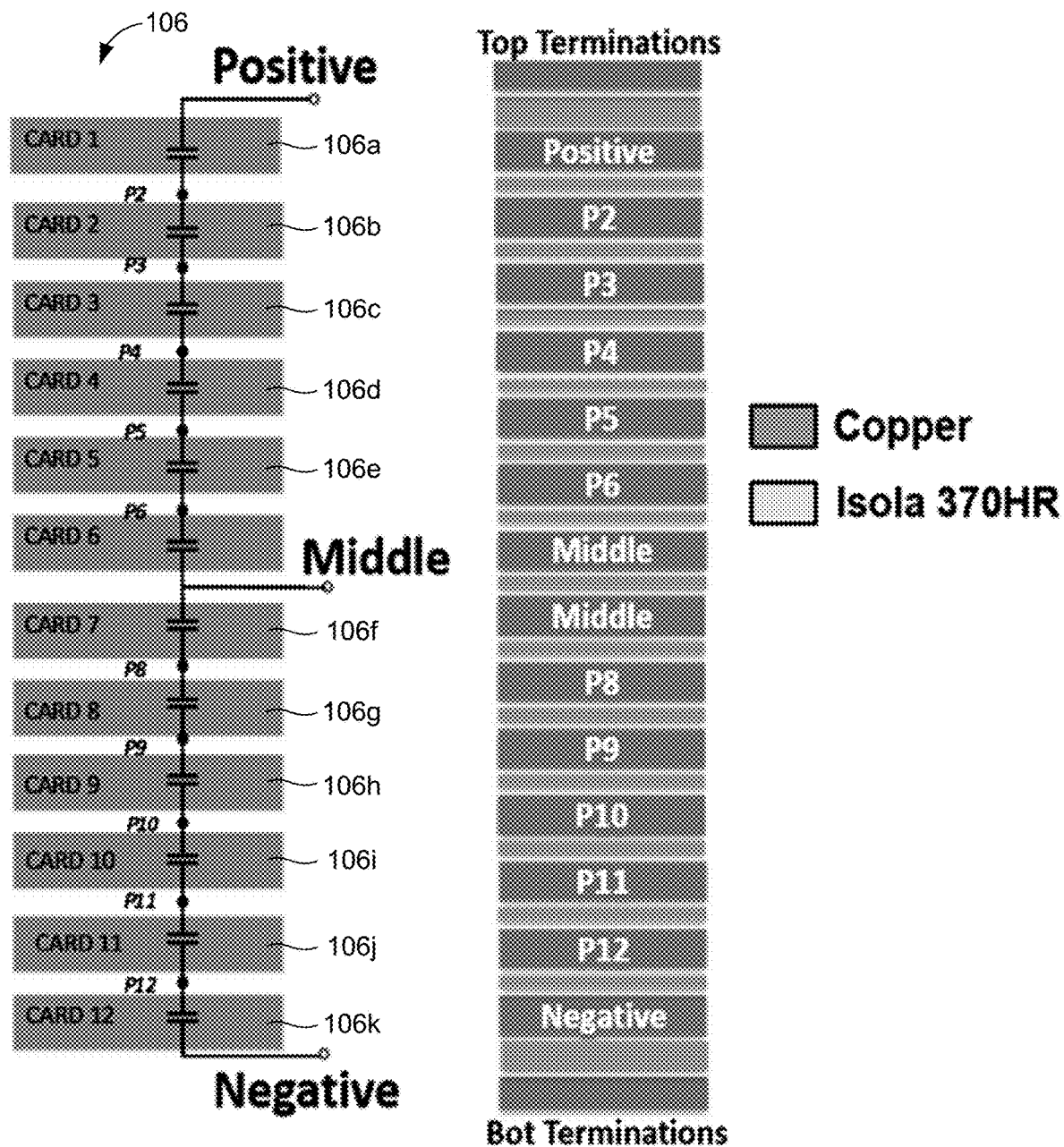
FIG. 8 illustrates connection points establishing electrical nets between the laminated motherboard and the twelve capacitor daughtercards shown in FIG. 2 according to aspects of the embodiments described herein.

The laminated motherboard 103 can be configured to interface the 12 capacitor daughtercards 106 and as such, can accommodate at least thirteen (13) electrical nets. The laminated motherboard 103 includes connectors 727-739, which can be utilized as a connecting medium to connect the 12 capacitor daughtercards 106 to conductor layers of the laminated motherboard 103. Electrical nets DC+, P2-P6, MID, P8-P12, and DC− can correspond to different nodes between each of the capacitor daughtercards 106 as shown in FIG. 8. As shown in FIG. 8, the 12 capacitor daughtercards 106 can include individual capacitor daughtercards 106a-106k. Potentials of the aforementioned electrical nets can correspond to potentials of the different nodes between each of the 12 capacitor daughtercards 106. For example, the potential of the electrical net P2 can correspond to the potential of a node between the first capacitor daughtercard 106a and the second capacitor daughtercard 106b. The potential of the electrical net P3 can correspond to the potential of a node between the second capacitor daughtercard 106b and the third capacitor daughtercard 106c. The different nodes between each of the capacitor daughtercards 106 are indicated by dots in the representative circuit. Furthermore, each of the aforementioned electrical nets and each of the nodes may correspond to a dedicated conductor layer of the laminated motherboard 103.

As the connectors 727-739 can function as a connecting medium, the connectors 727-739 can correspond to the different electrical nets DC+, P2-P6, MID, P8-P12, and DC−. In various embodiments, the connector 727 can correspond to the electrical net DC+; the connectors 728a and 728b can correspond to the electrical net P2; the connectors 729a and 729b can correspond to the electrical net P3; the connectors 730a and 730b can correspond to the electrical net P4; the connectors 731a and 731b can correspond to the electrical net P5; the connectors 732a and 732b can correspond to the electrical net P6; the connectors 733a and 733b can correspond to the electrical net P7; the connectors 734a and 734b can correspond to the electrical net P8; the connectors 735a and 735b can correspond to the electrical net P9; the connectors 736a and 736b can correspond to the electrical net P10; the connectors 737a and 737b can correspond to the electrical net P11; the connectors 738a and 738b can correspond to the electrical net P12; and the connector 739 can correspond to the electrical net DC−.

As shown in FIG. 8, the electrical nets DC+, P2-P6, MID, P8-P12, and DC− can correspond to different nodes along a circuitry that includes the 12 capacitor daughtercards 106. Each of the 12 capacitor daughtercards 106 can connect electrically to the laminated motherboard 103 by utilizing two of the connectors 727-739 (shown in FIG. 7) in a vertical configuration. For example, the first capacitor daughtercard 106a can connect to the laminated motherboard 103 through the connectors 727 and 728a. The second capacitor daughtercard 106b can connect to the laminated motherboard 103 through the connectors 729a and 728b. The third capacitor daughtercard 106c can connect to the laminated motherboard 103 through the connectors 729b and 730a, and so on, as the interconnection layout of the 12 capacitor daughtercards can be in a vertical implementation (as shown in FIG. 4).

With respect to the aforementioned electrical nets, each electrical net can correspond to a unique potential during operation. Listing out a few examples, the potential of the electrical net P12 can be closer to that of the electrical net DC− than that of the electrical net DC+ because the electrical net P12, corresponding to a node between the eleventh capacitor daughtercard 106j and the twelfth capacitor daughtercard 106k, is located in the circuitry closer to the electrical net DC− than the electrical net DC+. The potentials of the other electrical nets P2-P11 follow a similar relationship based on respective locations of each electrical net, or the corresponding nodes, along the circuitry. To give another example, the potential of the electrical net P2 would be closer to that of the DC+ electrical net than that of the DC− electrical net, and would have a greater difference in potential $\Delta V$ from that of the electrical net P12 than, for example, those of the electrical nets P3-P6, MID, and P8-P11 during operation. The aforementioned relationship between the potentials of the electrical nets P2-P12 and the corresponding nodes along the circuitry can extend across the various embodiments of the present disclosure.

A layer stack-up, insulation thicknesses between successive conductor layers, and net spacings of conductor layers of the laminated motherboard 103 can be optimized according to the concepts described herein, to account for the enhanced E-fields inside a PCB stack ($E_{PCB}$) of the laminated motherboard 103 and at the PCB-air interface ($E_{air}$). A standard PCB structure with conductor layers on outer layers with a solder mask coating is not recommended for medium to high voltage applications for the following reasons: (i) the surface of the solder mask coating can have bubbles and other contamination leading to surface tracking between the outer conductor layer and an exposed pad of a different electrical net; (ii) the solder mask coating can scratch away easily exposing the coated conductor; (iii) the solder mask coating is a thin coating layer and does not contribute to a great reduction in the E-field at the PCB-air interface, which is critical.

Figure 11:
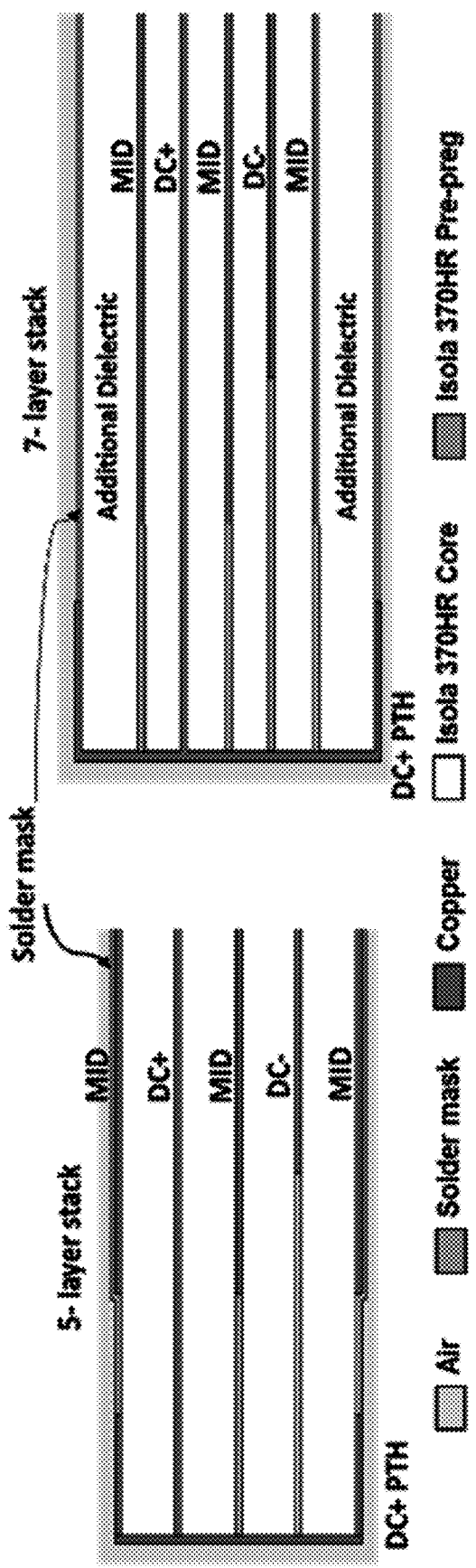
FIG. 11 illustrates an example five layer PCB stack that implements conductor layers in outer layers and an example seven layer PCB stack that implements conductor layers as internal layers according to aspects of the embodiments described herein.

Therefore, all conductor layers of the laminated motherboard 103 are implemented in internal layers of a PCB stack of the laminated motherboard 103, leaving external or outer layers of the PCB stack of the laminated motherboard 103 for surface terminations. Simulation results show that implementing conductor layers as internal layers and embedded with solid dielectric results in a 400% lower E-field at the PCB-air interface ($E_{air}$) compared to that of a standard PCB stack that implements conductor layers in outer layers. An example seven layer PCB stack that implements conductor layers as internal layers, and an example five layer PCB stack that implements conductor layers in outer layers are illustrated in FIG. 11.

For relatively lower voltage systems (less than or equal to 2 kV), it is common to apply one constant value of net spacings (distance from one edge of a conductor layer to an edge of specific PTH) for each conductor layer or electrical nets. The one constant value is probably derived from the experience of the designer. However, this is not applicable for medium to high voltage designs. In order to achieve a smooth field grading internal to the PCB stack of the laminated motherboard 103, each electrical net of the PCB stack can be designed as a planar conductor on a dedicated layer along with optimized net spacings from other conductor layers based on a change in potential $\Delta V$ between each electrical net or conductor layer. In addition, the optimized net spacings for each conductor layer in different sections of the PCB stack may be affected by the presence of PTHs and NPTHs. Similar to the four layer PCB stack 500 shown in FIG. 5, PCB stacks of the laminated motherboard 103 include net spacings for each conductor layer from a specific PTH. Furthermore, the net spacings may be optimized depending on differences in potential between those of the PTH and each of the conductor layers. Optimized net spacings from specific PTHs are discussed in greater detail below with respect to FIG. 9.

Figure 9A:
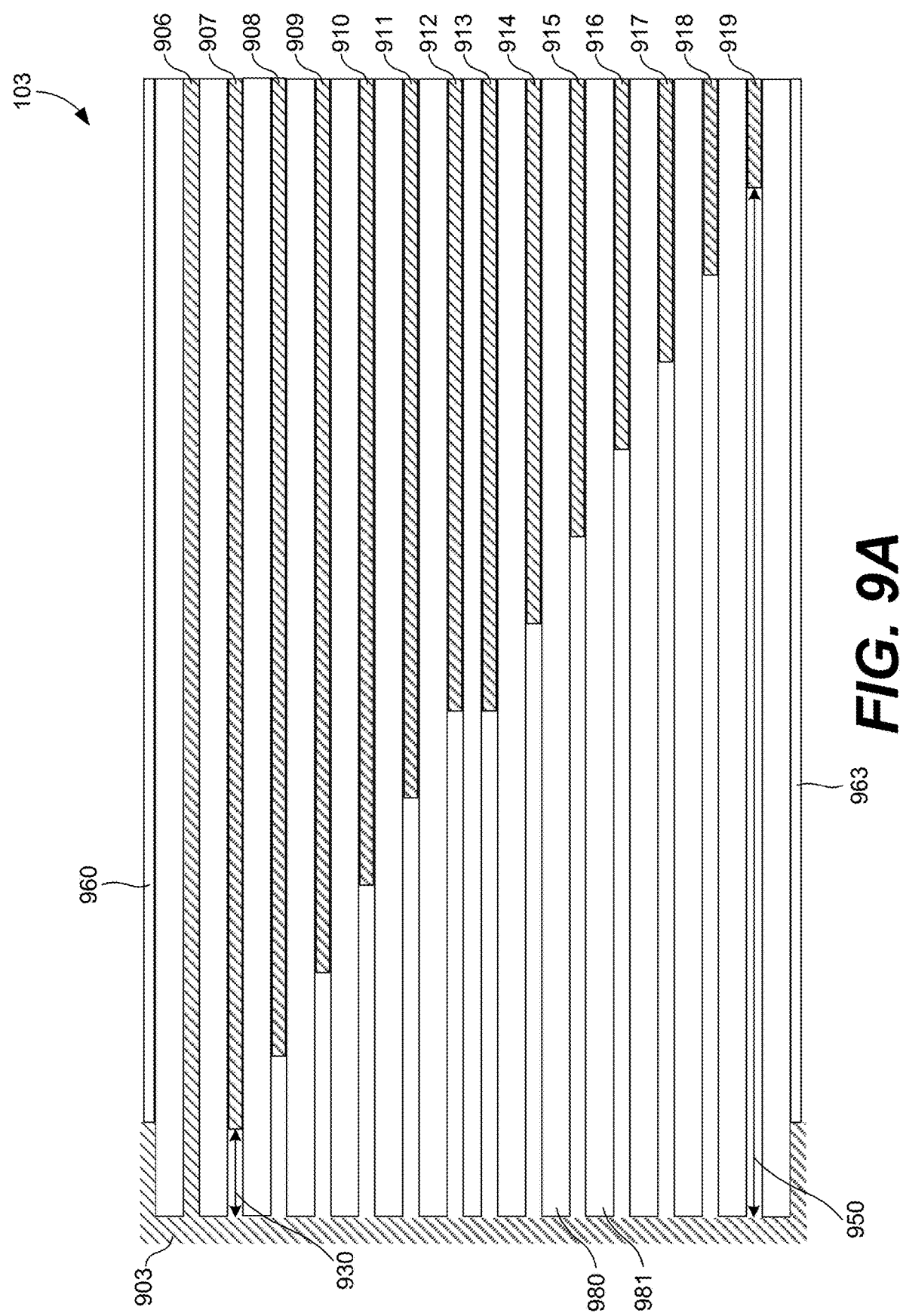
FIG. 9A illustrates net spacings of conductor layers of the laminated motherboard shown in FIG. 2, with respect to a plated through hole connected to a DC+ conductor layer according to aspects of the embodiments described herein.

FIG. 9A illustrates a cross section of a portion of the laminated motherboard 103 with a sixteen (16) layer PCB stack according to various embodiments. The 16 layer PCB stack of the laminated motherboard 103 includes fourteen (14) conductor layers 906-919, a top layer 960, and a bottom layer 963. The top layer 960 and the bottom layer 963 can include solder mask and component terminals but do not include any conductor layers. Each of the conductor layers 906-919 is embedded between dielectric layers, such as the conductor layer 915 being embedded between dielectric layers 980 and 981. The conductor layers 906-919 can be configured to electrically connect to the 12 capacitor daughtercards 106 through the connectors 727-739, as discussed for FIG. 7. Therefore, the conductor layers 906-919 can be configured to have potentials corresponding to those of the 13 electrical nets DC+, P2-P6, MID, P8-P12, respectively, during operation. Listing a few examples, the conductor layer 906 can be configured to share a potential with that of the DC+ electrical net with a connection to the first capacitor daughtercard 106a through the connector 727. The conductor layer 907 can be configured to share a potential with that of the P2 electrical net with a connection to the node between the first and the second capacitor daughtercards of the 12 capacitor daughtercards 106 through the connectors 728a and 728b. The conductor layer 908 can be configured to share a potential with that of the P3 electrical net with a connection to the node between the second and the third capacitor daughtercards of the 12 capacitor daughtercards 106 through the connectors 729a and 729b, and so on. The remaining conductor layers 909-919 can be configured to share potentials with those of the electrical nets P4-P6, MID, MID, P8-P12, and DC−, respectively, through connections to respective nodes of the 12 capacitor daughtercards 106, as described above for the conductor layers 906-908.

In the cross section of the laminated motherboard 103 shown, the conductor layer 906 is connected to a plated through hole (PTH) 903, and the two can be configured to share a DC+ electrical net. As can be seen, each of the conductor layers 907-919 have optimized "net spacings" from the PTH 903 that are different from one another based on potentials that would run across each of the conductor layers 907-919 during operation, with a net spacing being the spacing distance from one edge of a conductor layer to one edge of a PTH. For example, the net spacing of the conductor layer 912 is equal to the net spacing of the conductor layer 913 because the conductor layers 912 and 913 would share a common potential during operation that corresponds to the midpoint potential of the electrical net MID. The net spacings of the conductor layers 907-919 are based at least in part on a difference in potential to be applied during operation from the PTH 903 to a respective conductor layer of the conductor layers 907-919. The greater the difference in potential from the respective conductor layers 907-919 to the PTH 903 would be during operation, the greater the net spacing that would be implemented. Therefore, net spacing 930 of the conductor layer 907 is less than net spacing 950 of the conductor layer 919, as the difference in potential from the conductor layer 907 (corresponding to the electrical net P2) to the PTH 903 is lower than the difference in potential from the conductor layer 919 (corresponding to the electrical net DC−) to the PTH 903 during operation.

In use, the conductor layers 906-919 may have different voltages applied to each other, with the exception of the conductor layers 912 and 913 being MID conductor layers, which can share a ground potential during operation if the midpoint of the modular DC bus assembly 200 is electrically grounded. As explained in the preceding paragraphs, the potentials of the intermediate electrical nets P2-P6, MID, and P8-P12 can correspond to potentials across nodes of the 12 capacitor daughtercards 106 in the modular DC bus assembly 200. During operation, the difference in potential ΔV between the PTH 903 and the conductor layer 908 would be greater than the difference in potential between the PTH 903 and the conductor layer 907, leading to a greater net spacing for the conductor layer 908, and so on for the other conductor layers 909-919. Net spacings for each of the conductor layers 907-919, therefore, depend on differences in potential between the PTH 903 and a respective conductor layer of the conductor layers 907-919.

What is described above gives one implementation of optimized net spacings of the conductor layers 906-919 with the conductor layer 906 connected to the PTH 903, but many other implementations are possible depending on which conductor layer is connected to the PTH 903. For example, if the conductor layer 919 is connected to the PTH 903, then the net spacings of the conductor layers 906-918 would be of an inverted pattern compared to what is shown currently. This means that the net spacing of the conductor layer 918 from the PTH 903 would be the lowest in the 16 layer PCB stack, and the net spacing of the conductor layer 906 would be the greatest. Furthermore, what is described above assumes a progressively ordered stack where the second layer, or the conductor layer 906, connects to the DC+ electrical net, and the fifteenth layer, or the conductor layer 919, is connected to the DC− electrical net, with the intermediate layers 907-918 connecting to the intermediate electrical nets in an increasing sequence. Another implementation of optimized net spacings from the PTH 903 connected to the MID conductor layers 912 and 913 is shown in FIG. 9B.

Figure 9B:
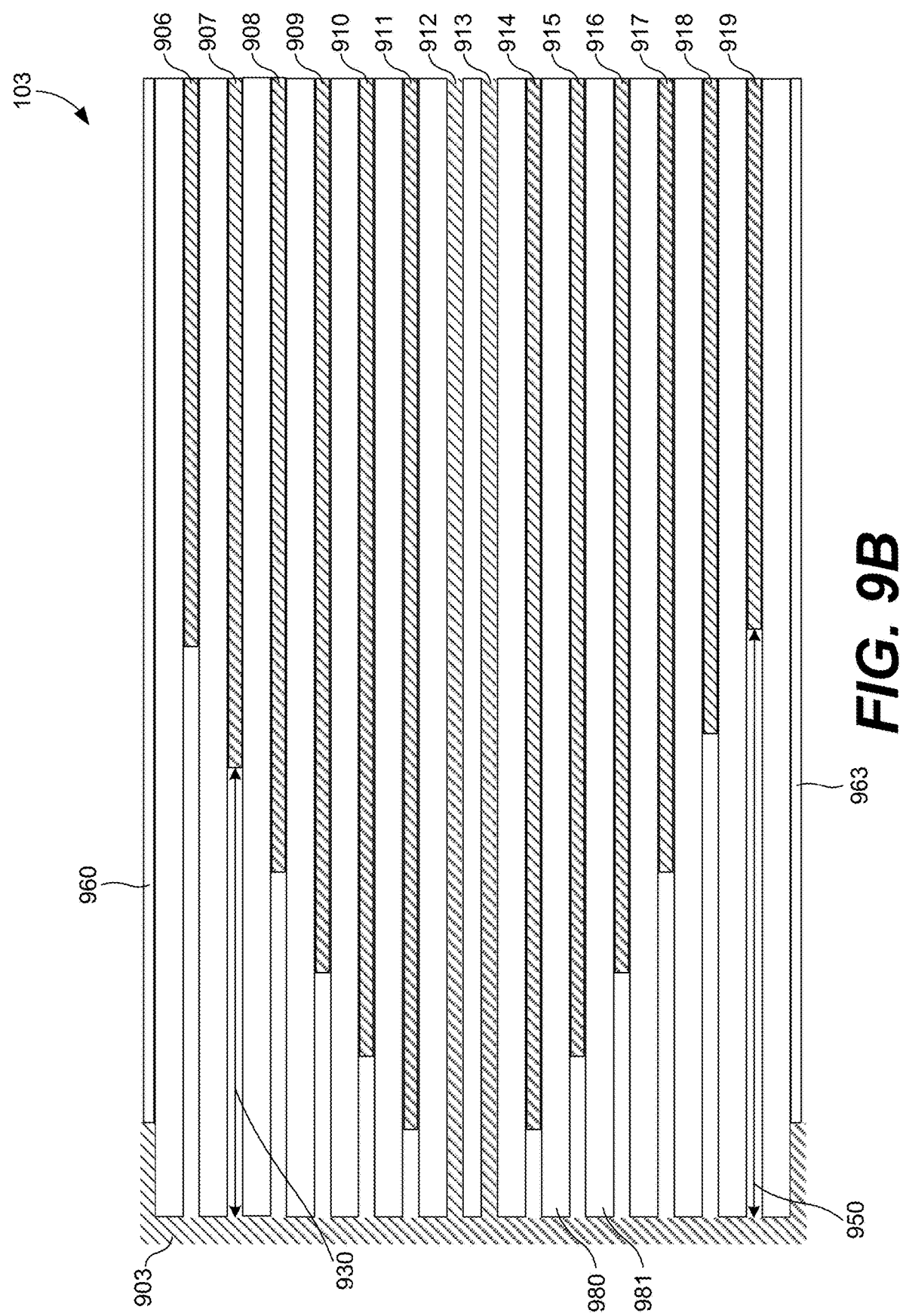
FIG. 9B illustrates net spacings of the conductor layers of the laminated motherboard shown in FIG. 2, with respect to the plated through hole connected to MID conductor layers according to aspects of the embodiments described herein.

FIG. 9B shows the cross section of the laminated motherboard 103 with the PTH 903 connected to the MID conductor layers 912 and 913. The net spacings of the conductor layers 906-911 and 914-919 follow an arrowhead shaped pattern due to the new differences in potential from the PTH 903 that would be applied during operation. For example, during operation, the PTH 903 here would share a common potential with the MID conductor layers 912 and 913, and the greatest change in potential from the PTH 903 would be the potentials of the conductor layers 906 and 919. Although the potentials of the conductor layers 906 and 919 would not be equal (DC+ vs DC−), the differences in potential from the PTH 903 would be equal. Therefore, the net spacing 950 of the conductor layer 919 would be the same as the net spacing for the conductor layer 906. Similarly, the net spacings of the conductor layers 911 and 914 would be equal; 910 and 915 would be equal; 909 and 916 would be equal; 908 and 917 would be equal; and 907 and 918 would be equal. The described equal net spacings between pairs of the conductor layers 906-911 and 914-919 are based on the potentials of the corresponding electrical nets DC+, P2-P6, P8-P12, and DC− that would be applied during operation. For example, referring back to FIG. 8, the electrical nets P6 and P8 would have equal differences in potential from the electrical net MID, while P5 and P9 would have equal differences in potential from the electrical net MID, and so on for the remaining electrical nets DC+, P2-P4, P10-P12, and DC−. Therefore, the 16 layer PCB stack of the laminated motherboard 103 includes optimized net spacings of the conductor layers 906-919 depending on which conductor layer is connected to the PTH 903. The laminated motherboard 103 may have more PTHs in other portions of the 16 layer PCB stack, in which conductor layers near those PTHs would have optimized net spacings depending on changes in potential from those PTHs as well.

Implementing net spacings for the conductor layers 906-919 based on differences in potential to be applied during operation, as described above, allows the laminated motherboard 103 to have a lower total insulation thickness to meet the design rules specified in FIG. 6, compared to a traditional PCB structure implementing same net spacings for each conductor layer. Furthermore, implementation of the optimized net spacings can result in reduction of stray inductance. Comparing a four layer PCB stack with the 16 layer PCB stack of the laminated motherboard 103, both being 220 mils according to one embodiment, resulted in the 16 layer PCB stack having a maximum $E_{air}$=1.3 kV/mm and $E_{PCB}$=15 kV/mm, staying within the design rules of $E_{air\text{-}limit}$=2 kV/mm and $E_{PCB\text{-}limit}$=20 kV/mm. The four layer PCB stack resulted in a maximum $E_{air}$ greater than 2.0 kV/mm. Total PCB insulation thickness can be reduced by greater than 50% from the four layer PCB stack compared to the 16 layer PCB stack of the laminated motherboard 103.

The laminated motherboard 103 also includes non-plated through holes (NPTHs), which need to be considered in analyzing E-fields inside the PCB stack and at the PCB-air interface of the laminated motherboard 103. NPTHs are often overlooked in analyzing E-fields because there are no electrical contacts at these apertures. However, enhanced E-fields due to conductor edges at these apertures can cause $E_{air}$ to exceed the design rules specified in FIG. 6. Because of the absence of electrical contacts at a NPTH of PCB stacks of the laminated motherboard 103, it may appear that equal spacings from the NPTH can be applied to all conductor layers, but doing so would result in the design limit of $E_{air-limit}$=2 kV/mm being exceeded.

Figure 10:
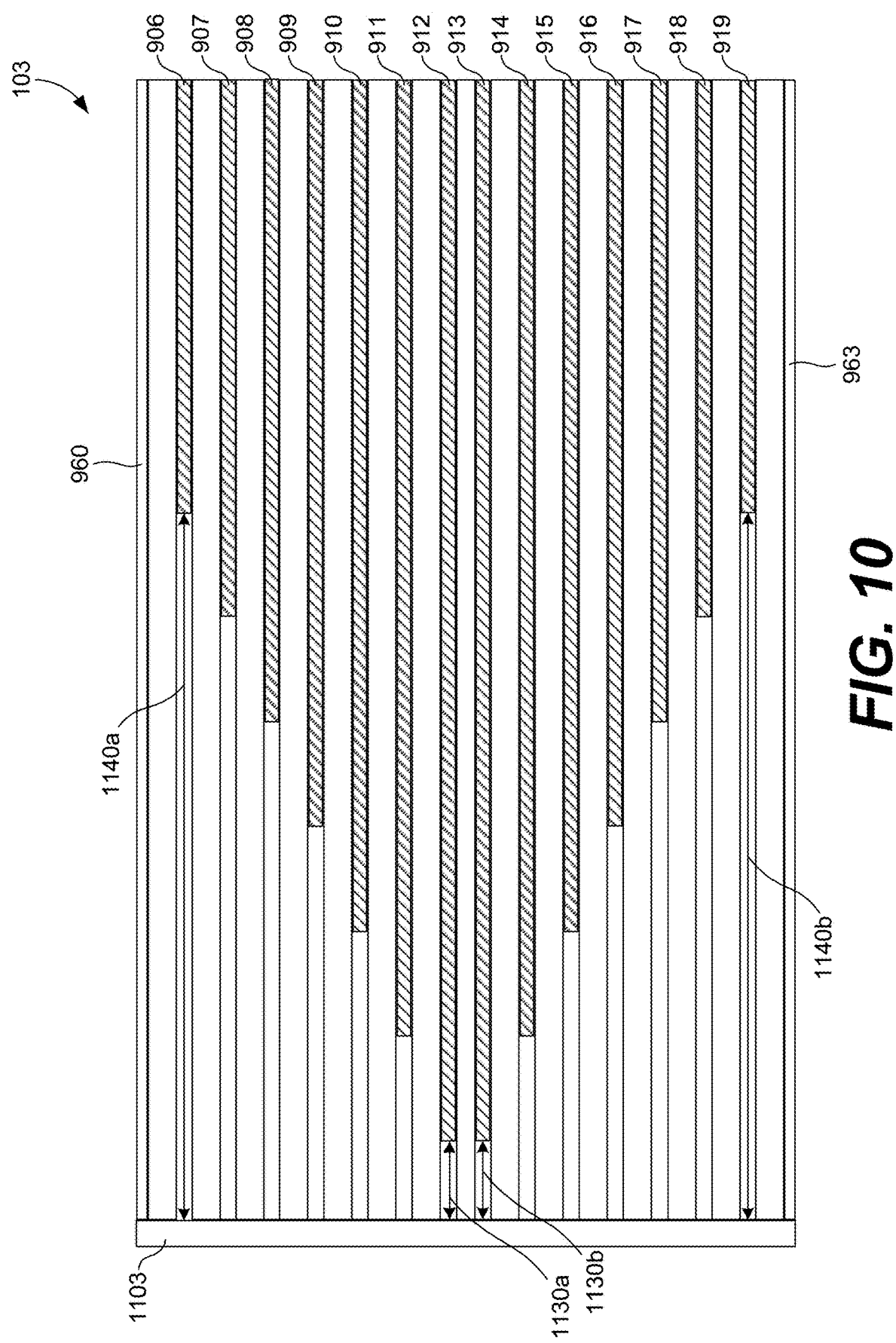
FIG. 10 illustrates edge spacings of the conductor layers of the laminated motherboard shown in FIG. 2, with respect to a non-plated through hole according to aspects of the embodiments described herein.

FIG. 10 illustrates a cross section of the 16 layer PCB stack of the laminated motherboard 103 at a NPTH 1103 according to various embodiments. Each of the conductor layers 906-919 is spaced differently from the NPTH 1103 based on potentials to be applied to each of the conductor layers 906-919 during operation. In one embodiment, a preferred spacing pattern from the NPTH 1103 includes the MID conductor layers 912 and 913 being spaced closest to the NPTH 1103. The distance from one edge of a conductor layer to one edge of a non-plated through hole is termed an "edge spacing." As shown in FIG. 10, the distance from one edge of the conductor layer 912 to an edge of the NPTH 1103 is edge spacing 1130*a*. As the difference in potential between the MID conductor layer 913 and the MID conductor layer 912 would be zero during operation, edge spacing 1130*b* of the MID conductor layer 913 equals the edge spacing 1130*a*. Similarly, edge spacings of the conductor layers 911 and 914 are equal; 910 and 915 are equal; 909 and 916 are equal; 908 and 917 are equal; 907 and 918 are equal; and 906 and 919 are equal as the differences in potential among each pair of the conductor layers listed to the MID conductor layers 912 and 913 would be equal during operation. The edge spacings 1130*a* and 1130*b* are the smallest of the conductor layers 906-919. From then on, the edge spacings of the remaining conductor layers 906-911 and 914-919 increase in the following order of the pairs of the conductor layers listed: 911 and 914, 910 and 915, 909 and 916, 908 and 917, 907 and 918, and 906 and 919, with edge spacings 1140*a* and 1140*b* of the conductor layers 906 and 919, respectively, being the largest.

The preferred spacing pattern described above may depend on differences in potential, during operation, between the MID conductor layers 912 and 913 and the other conductor layers 906-911 and 914-919. As the conductor layers 906-919 are tied to the electrical nets DC+, P2-P6, MID, MID, P8-P12, and DC−, respectively, the differences in potential between each of the conductor layers 906-919 during operation can stay proportional regardless of the voltages applied from a power supply. The greater the difference in potential would be from the MID conductor layers 912 and 913 during operation, the greater the edge spacing would be for a respective conductor layer of the conductor layers 906-911 and 914-919. Therefore, the edge spacings 1140*a* and 1140*b* are the largest because the difference in potential between the MID conductor layers 912 and 913 and the conductor layers 906 and 919 is the largest among the other conductor layers 907-911 and 914-918. The preferred spacing pattern described is applicable to other NPTHs and at board edges of the laminated motherboard 103. The preferred spacing pattern described can prevent surface discharge, which would otherwise occur if equal edge spacings were to be applied for the conductor layers 906-919 from the NPTH 1103.

Figure 12:
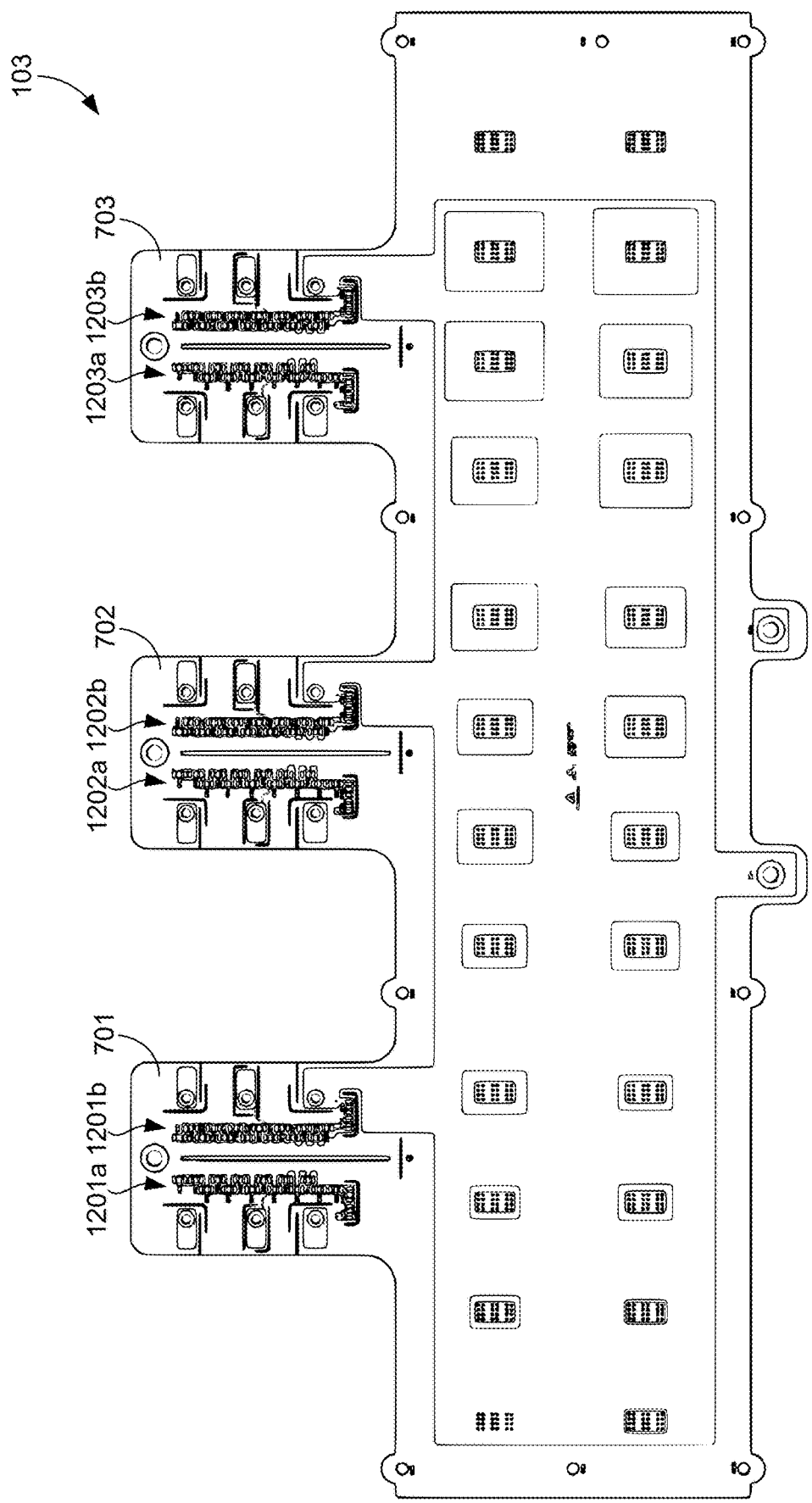
FIG. 12 illustrates a top side of the laminated motherboard shown in FIG. 2, which shows series-device static balancing resistors implemented as surface mounts (SMT) with embedded shielding for each of three phase-leg modules according to aspects of the embodiments described herein.

FIG. 12 illustrates a top side of the laminated motherboard 103 with the three phase-leg modules 701, 702, and 703 according to various embodiments of the present disclosure. Each of the phase-leg modules 701, 702, and 703 includes device static balancing resistors for the series configuration of power devices utilized in this example with embedded shielding. The phase-leg module 701 includes device static balancing resistors 1201*a* and 1201*b* with embedded shielding; the phase-leg module 702 includes device static balancing resistors 1202*a* and 1202*b* with embedded shielding; and the phase-leg module 703 includes device static balancing resistors 1203*a* and 1203*b* with embedded shielding. The device static balancing resistors 1201*a*, 1201*b*, 1202*a*, 1202*b*, 1203*a*, and 1203*b* with embedded shielding can be implemented into the PCB laminated motherboard 103 as SMT pads. As shown previously in FIG. 5, exposed terminations such as PTHs and SMT pads on a PCB stack can serve as triple junction points prone to peak E-field crowding. Similarly, the laminated motherboard 103 can have these triple junction points at exposed terminations such as PTHs and SMT pads. Therefore, a layout shielding technique is needed to mitigate field crowding at these triple points for PCB stacks of the laminated motherboard 103.

Figure 13:
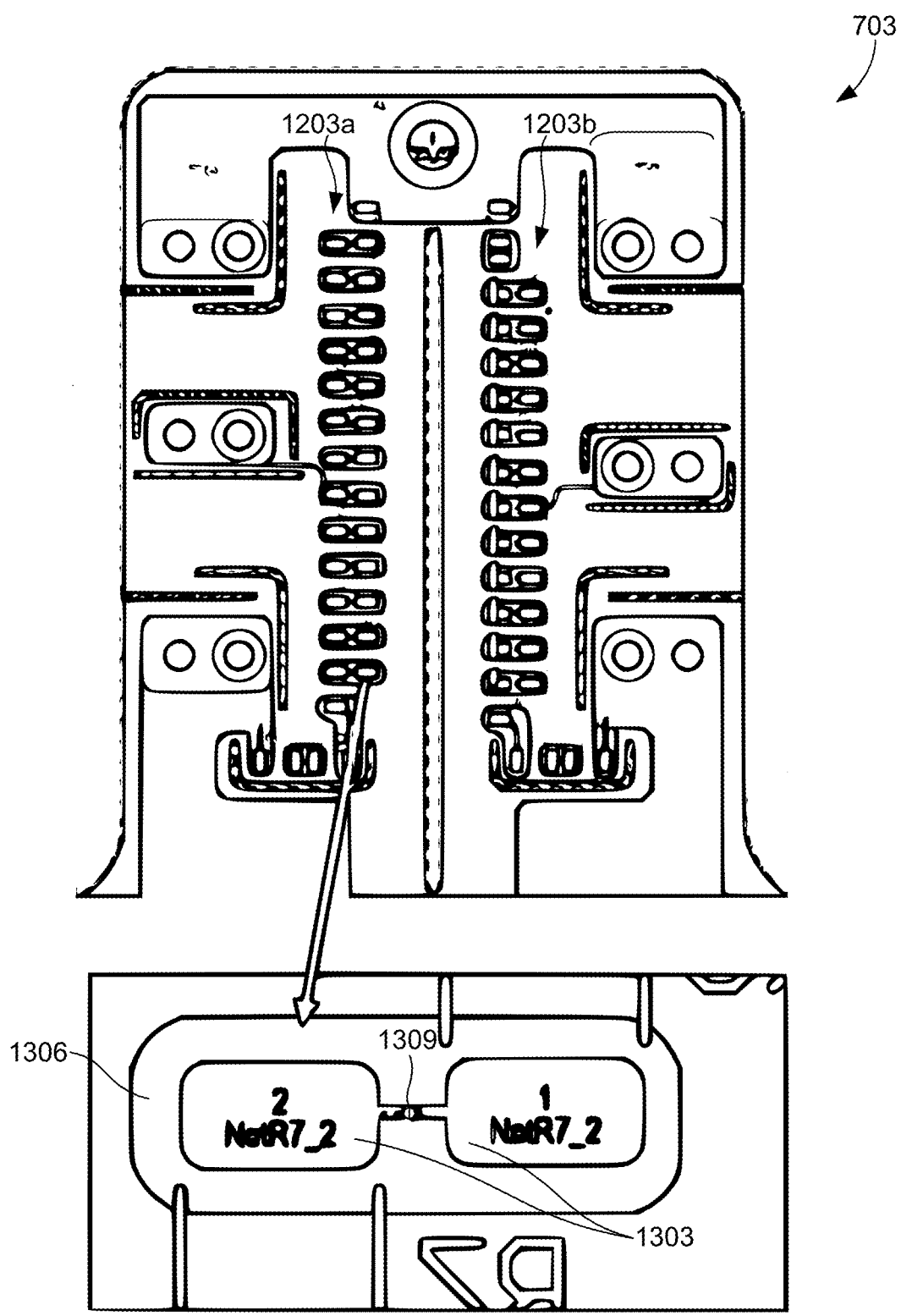
FIG. 13 illustrates a close-up view of one phase-leg module of the laminated motherboard shown in FIG. 2, including a further close-up view of an individual static balancing resistor with embedded shielding according to aspects of the embodiments described herein.

FIG. 13 illustrates a close-up view of the phase-leg module 703, which includes the device static balancing resistors 1203*a* and 1203*b* with embedded shielding. A further close-up view of one of the device static balancing resistors 1203*a* shows an individual device static balancing resistor 1303 with an individual embedded shielding 1306 to mitigate field crowding for the individual device static balancing resistor 1303. The individual device static balancing resistor 1303 can include several SMT resistors connected in series to form the individual device static balancing resistor 1303. The individual embedded shielding 1306 can be a conductor embedded one layer beneath or above the individual device static balancing resistor 1303 depending on whether the individual device static balancing resistor 1303 is located on top or bottom surfaces of the PCB stacks of the laminated motherboard 103.

In addition, the individual embedded shielding 1306 can share a same potential as the individual device static balancing resistor 1303 through a via 1309. The individual embedded shielding 1306 can have a polygon shape designed to be dimensionally larger than the individual device static balancing resistor 1303 pad in the XY plane. The larger dimensions allow electric field distributions to be modified such that the peak E-field is along an edge of the individual embedded shielding 1306 submerged in solid insulation, rather than at a PCB surface of the laminated motherboard 103. Implementation of the embedded shielding for the device static balancing resistors 1201*a*, 1201*b*, 1202*a*, 1202*b*, 1203*a*, and 1203*b* can result in reduced surface discharge along triple junction points corresponding to exposed terminations of the device static balancing resistors 1201*a*, 1201*b*, 1202*a*, 1202*b*, 1203*a*, and 1203*b*.

The described embedded shielding technique is beneficial as the E-field limit for $E_{PCB}$ is greater than that of $E_{air}$. Implementation of the embedded shielding causes peak E-fields to be pulled into or distributed into an internal layer of the PCB stacks of the laminated motherboard 103, rather than existing along an external surface of the PCB stacks. Simulation results have shown that the peak E-field at the triple points corresponding to the device static balancing resistors 1201*a*, 1201*b*, 1202*a*, 1202*b*, 1203*a*, and 1203*b* was reduced by approximately 85% when the embedded shielding was implemented, going down from approximately 8 kV/mm without the embedded shielding to 1.2 kV/mm with the embedded shielding. The embedded shielding technique described in relation to the individual device static balancing resistor 1303 may be applied to other surface terminations that exist on the laminated motherboard 103, such as PTHs and other SMT pads that may be located on the top or the bottom surfaces of the PCB stacks of the laminated motherboard 103.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

The term "substantially" is meant to permit deviations from the descriptive term that don't negatively impact the intended purpose. Descriptive terms are implicitly understood to be modified by the word substantially, even if the term is not explicitly modified by the word substantially.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about 'y'".

Therefore, at least the following is claimed:

1. An assembly configured for power delivery, comprising:
   a plurality of distributed daughtercards forming a capacitor bank, each of the plurality of distributed daughtercards comprising an array of capacitors; and
   a laminated motherboard for the assembly, the laminated motherboard configured to electrically interface the plurality of distributed daughtercards, each of the plurality of distributed daughtercards connecting to the laminated motherboard through a plurality of connectors located on a bottom side of the laminated motherboard, the plurality of distributed daughtercards and the laminated motherboard forming a modular direct current (DC) bus assembly, the laminated motherboard comprising:
   a first phase-leg module, a second phase-leg module, and a third phase-leg module; and
   a layer stack with a plurality of conductor layers for the first phase-leg module, the second phase-leg module, and the third phase-leg module.

2. The assembly of claim 1, wherein the plurality of distributed daughtercards comprise low voltage distributed daughtercards, the plurality of distributed daughtercards being connected in a series configuration to form a medium voltage capacitor bank of a desired target voltage.

3. The assembly of claim 2, wherein each node between any two consecutive distributed daughtercards in the series configuration of the plurality of distributed daughtercards connects to a dedicated conductor layer of the layer stack of the laminated motherboard.

4. The assembly of claim 1, wherein each of the plurality of connectors connect to a dedicated conductor layer of the laminated motherboard.

5. The assembly of claim 1, wherein each of the first phase-leg module, the second phase-leg module, and the third phase-leg module comprises a positive DC terminal and a negative DC terminal, an edge of the positive DC terminal being at least 1 centimeter (cm) apart horizontally from an edge of the negative DC terminal.

6. The assembly of claim 1, wherein a top layer and a bottom layer of the layer stack do not comprise conductor layers coated with a solder mask.

7. The assembly of claim 1, wherein the array of capacitors comprise low voltage capacitors, the array of capacitors connected in a parallel configuration to achieve a target capacitance.

8. The assembly of claim 1, wherein, in the laminated motherboard, the first phase-leg module, the second phase-leg module, and the third phase-leg module comprise device static balancing resistors with embedded shielding, the embedded shielding configured to redistribute electric field distribution around a printed circuit board (PCB) surface of the laminated motherboard so that peak electric fields at triple points formed at interconnections of the PCB surface are mitigated.

9. The assembly of claim 1, wherein:
   the laminated motherboard further comprises a plated through hole (PTH) connected to a conductor layer among the plurality of conductor layers; and
   net spacings with respect to the PTH of conductor layers not connected to the PTH among the plurality of conductor layers are based at least in part on a potential to be applied to the conductor layer connected to the PTH.

10. The assembly of claim 9, wherein the net spacings of the conductor layers not connected to the PTH among the plurality of conductor layers are based at least in part on differences in potentials between potentials to be applied to each of the conductor layers not connected to the PTH as compared to the potential to be applied to the conductor layer connected to the PTH.

11. The assembly of claim 9, further comprising embedded shielding implemented one layer in the layer stack below or above the PTH, the embedded shielding configured to redistribute electric field distribution around a printed circuit board (PCB) surface of the laminated motherboard so that peak electric fields at triple points formed at interconnections of the PCB surface are mitigated.

12. The assembly of claim 1, wherein nodes between each of the plurality of distributed daughtercards are configured to connect to the plurality of connectors located on the bottom side of the laminated motherboard, the plurality of connectors corresponding to a plurality of electrical nets of the laminated motherboard.

13. The assembly of claim 12, wherein each of the plurality of electrical nets corresponds to a different conductor layer of the plurality of conductor layers.

14. The assembly of claim 1, wherein a MID conductor layer configured to have a mid-point potential among the plurality of conductor layers is spaced closest to a board edge or a non-plated through hole (NPTH) as compared to remaining conductor layers among the plurality of conductor layers, the remaining conductor layers being spaced from the board edge or the NPTH based at least in part on differences in potentials between potentials to be applied to each of the remaining conductor layers as compared to a potential to be applied to the MID conductor layer, the MID conductor layer configurable to be electrically grounded.

15. A laminated motherboard configured for a bus assembly, comprising:
   a layer stack with a plurality of conductor layers;
   a first phase-leg module, a second phase-leg module, and a third phase-leg module; and
   a plated through hole (PTH) connected to a conductor layer among the plurality of conductor layers, wherein net spacings with respect to the PTH of conductor layers not connected to the PTH among the plurality of conductor layers are based at least in part on differences in potentials between potentials to be applied to each of the conductor layers not connected to the PTH as compared to a potential to be applied to the PTH.

16. The laminated motherboard of claim 15, wherein the net spacings with respect to the PTH of each of the conductor layers not connected to the PTH increase as differences in potentials between potentials to be applied to each of the conductor layers not connected to the PTH as compared to a potential to be applied to the PTH increase.

17. The laminated motherboard of claim 15, wherein each of the first phase-leg, the second phase-leg, and the third phase-leg comprises a plurality of device static balancing resistors with embedded shielding, the plurality of device static balancing resistors being mounted as surface mount (SMT) parts.

18. The laminated motherboard of claim 17, wherein the embedded shielding is embedded one layer in the layer stack above or below the plurality of device static balancing resistors.

19. The laminated motherboard of claim 17, wherein each of the plurality of device static balancing resistors with embedded shielding comprises individual embedded shielding.

20. The laminated motherboard of claim 15, wherein a top layer and a bottom layer of the layer stack do not comprise conductor layers coated with a solder mask.

* * * * *

UNITED STATES PATENT AND TRADEMARK OFFICE
CERTIFICATE OF CORRECTION

PATENT NO. : 11,271,492 B2
APPLICATION NO. : 16/939914
DATED : March 8, 2022
INVENTOR(S) : Lakshmi Ravi et al.

It is certified that error appears in the above-identified patent and that said Letters Patent is hereby corrected as shown below:

On the Title Page (73): Assignee should read: Virginia Tech Intellectual Properties, Inc.

Signed and Sealed this
Fourteenth Day of November, 2023

Katherine Kelly Vidal
*Director of the United States Patent and Trademark Office*